(12) United States Patent
Murata et al.

(10) Patent No.: US 11,309,898 B2
(45) Date of Patent: Apr. 19, 2022

(54) SEMICONDUCTOR INTEGRATED CIRCUIT

(71) Applicant: OLYMPUS CORPORATION, Hachioji (JP)

(72) Inventors: Yutaka Murata, Tokyo (JP); Akira Ueno, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 17/167,374

(22) Filed: Feb. 4, 2021

(65) Prior Publication Data
US 2021/0159903 A1 May 27, 2021

Related U.S. Application Data

(63) Continuation of application No. PCT/JP2018/029922, filed on Aug. 9, 2018.

(51) Int. Cl.
*H03L 7/099* (2006.01)

(52) U.S. Cl.
CPC ..................... *H03L 7/099* (2013.01)

(58) Field of Classification Search
CPC ................... H03L 7/099; H03L 7/08
See application file for complete search history.

(56) References Cited

U.S. PATENT DOCUMENTS

| | | | | |
|---|---|---|---|---|
| 6,310,851 B1 * | 10/2001 | Tobita | ................ | G11B 7/00718 369/111 |
| 6,385,257 B1 * | 5/2002 | Tobita | .................... | G11B 7/128 |
| 7,545,131 B1 * | 6/2009 | Alexander | ............ | H02M 3/156 323/275 |
| 9,391,560 B2 * | 7/2016 | Takebayashi | ............. | G06F 1/10 |
| 9,602,115 B1 * | 3/2017 | Rozental | ............... | H03L 7/1806 |
| 11,082,051 B2 * | 8/2021 | Allan | ...................... | H03L 7/087 |
| 2003/0030425 A1 * | 2/2003 | Delbo | ................... | H03L 7/0891 324/76.53 |

(Continued)

FOREIGN PATENT DOCUMENTS

| | | |
|---|---|---|
| JP | S1-264911 A | 11/1986 |
| JP | 2000-100163 A | 4/2000 |

(Continued)

OTHER PUBLICATIONS

International Search Report dated Nov. 6, 2018, issued in counterpart International Application No. PCT/JP2018/029922 (4 pages, including Japanese original and English translation).

(Continued)

*Primary Examiner* — Adam D Houston
(74) *Attorney, Agent, or Firm* — WHDA, LLP

(57) ABSTRACT

A semiconductor integrated circuit includes: a phase synchronization circuit configured to be synchronized with a reference clock signal and to generate a synchronization clock signal by multiplying the reference clock signal; an edge detection circuit configured to detect an edge at which a signal waveform of the reference clock signal changes at a timing of the synchronization clock signal and to output an edge detection signal indicating the timing at which the edge has been detected; and a clock division circuit configured to be reset at a timing based on the edge detection signal and to generate a divided clock signal by dividing the synchronization clock signal.

11 Claims, 10 Drawing Sheets

(56) References Cited

U.S. PATENT DOCUMENTS

| | | | | |
|---|---|---|---|---|
| 2003/0071665 | A1* | 4/2003 | Oyama | H03L 7/0814 |
| | | | | 327/116 |
| 2015/0102862 | A1* | 4/2015 | Ishimaru | H03B 19/00 |
| | | | | 331/60 |
| 2017/0134031 | A1* | 5/2017 | Ezell | G06F 1/10 |
| 2019/0011945 | A1* | 1/2019 | Fayneh | G06F 1/08 |

FOREIGN PATENT DOCUMENTS

| | | |
|---|---|---|
| JP | 2000-148668 A | 5/2000 |
| JP | 2002-271181 A | 9/2002 |
| JP | 2007-259435 A | 10/2007 |
| JP | 2011-4248 A | 1/2011 |
| JP | 2011-160097 A | 8/2011 |
| JP | 2015-80049 A | 4/2015 |

OTHER PUBLICATIONS

Office Action dated Oct. 12, 2021, issued in counterpart JP application No. 2020-535426, with English translation (5 pages).

* cited by examiner

SEMICONDUCTOR INTEGRATED CIRCUIT

CROSS REFERENCE TO RELATED APPLICATIONS

This application is a continuation application based on a PCT Patent Application No. PCT/JP2018/029922, filed on Aug. 9, 2018, the entire content of which is hereby incorporated by reference.

BACKGROUND

Technical Field

The invention relates to a semiconductor integrated circuit.

Background Art

There are devices in which a large-scale semiconductor integrated circuit that realizes a predetermined function by operating various circuit elements formed on a semiconductor substrate is mounted such as an application-specific integrated circuit (ASIC). In such a device, various elements (such as digital circuits or analog circuits) including a semiconductor integrated circuit such as an ASIC are mounted on a system board constituting the device and the elements mounted on the system board share a power supply. The elements constituting such a device include elements that operate based on a clock signal of a predetermined frequency. Accordingly, a clock supply circuit that supplies a clock signal of a predetermined frequency oscillated by a crystal oscillator, a crystal oscillation circuit, or the like to the elements is also mounted on the system board of the device. In such a device, the clock supply circuit mounted on the system board shares the power supply with the other elements.

In a semiconductor integrated circuit such as an ASIC, when an output signal output from a circuit element formed on a semiconductor substrate in accordance with an input signal transitions from one state (level) to another state (level), a current such as a passing current or a charging/discharging current for a load flows between the power supply and the ground. The current flowing between the power supply and the ground in the semiconductor integrated circuit flows to a greater extent as the number of circuit elements simultaneously outputting an output signal increases. The current flowing between the power supply and the ground in the semiconductor integrated circuit serves as power supply noise (self-noise) that is generated in the semiconductor integrated circuit and affects the supply of power for the elements mounted on the system board.

Particularly, power supply noise which is generated when circuit elements operating based on an input clock signal, that is, circuit elements operating in synchronization with a clock signal, out of the circuit elements formed on the semiconductor substrate operate flows at a timing synchronized with the clock signal. Accordingly, the power supply noise synchronized with the clock signal in the semiconductor integrated circuit increases fluctuation (jitter) of a clock signal which is supplied (distributed) to elements or circuit elements from the clock supply circuit sharing the power supply, a clock buffer circuit formed in the semiconductor substrate, or the like. This is because, for example, when power supply noise is generated while the input clock single is transitioning from a "low" level to a "high" level in the clock buffer circuit, a threshold voltage of a gate terminal (a so-called gate threshold voltage Vth) prescribed in a transistor constituting the clock buffer circuit fluctuates due to an influence of the power supply noise and a delay time when the clock signal passes through the clock buffer circuit fluctuates.

In a system of such a device, fluctuation (jitter) of the clock signal due to the power supply noise generated in the semiconductor integrated circuit has a great influence on operations of the elements in the system board on which the semiconductor integrated circuit is mounted and serves as a cause of deterioration in performance of the system of the device as a whole. Accordingly, in the system of the device, it is preferable that generation of power supply noise serving as a cause of an increase in fluctuation (jitter) of a clock signal in a semiconductor integrated circuit such as an ASIC be curbed or that the semiconductor integrated circuit operate at a timing at which a clock signal does not fluctuate (jitter is not caused).

Accordingly, for example, a technique of curbing generation of jitter of a clock signal due to power supply noise by adjusting a phase of the clock signal is disclosed in Japanese Unexamined Patent Application, First Publication No. 2011-004248 (hereinafter referred to as Patent Literature 1). In the technique disclosed in Patent Literature 1, a delay measurement circuit that measures a delay time of a clock signal, a time measurement circuit that measures a fluctuation time of a source voltage, a delay adjustment circuit that delays a clock signal, a phase difference measurement circuit that measures a phase difference between clock signals, and a phase control circuit that controls a phase of a clock signal are provided. In the technique disclosed in Patent Literature 1, the phase control circuit calculates a phase difference between clock signals at which jitter is optimized based on the period, the fluctuation time, and the delay time of the clock signal and adjusts a delay amount in the delay adjustment circuit such that the phase difference between clock signals measured by the phase difference measurement circuit reaches the calculated phase difference.

However, the technique disclosed in Patent Literature 1 is a technique of adjusting a phase difference between two clock signals but is not a technique of curbing generation of fluctuation (jitter) of a clock signal serving as a reference of an operation. In the technique disclosed in Patent Literature 1, since a plurality of measurement circuits that measure various states of clock signals are provided, the configuration thereof is complicated even when the technique is applied to curb generation of fluctuation (jitter) of a clock signal serving as a reference. In the technique disclosed in Patent Literature 1, since measurement of a clock signal or calculation and adjustment of a phase difference needs to be performed whenever a system of a device is returned from a reset state, there is concern about starting of the device being delayed.

SUMMARY

The invention was made based on recognition of the aforementioned problem and an objective thereof is to provide a semiconductor integrated circuit that can curb fluctuation of a clock signal due to power supply noise which is generated in the semiconductor integrated circuit.

A semiconductor integrated circuit according to a first aspect of the invention includes: a phase synchronization circuit configured to be synchronized with a reference clock signal and to generate a synchronization clock signal by multiplying the reference clock signal; an edge detection circuit configured to detect an edge at which a signal waveform of the reference clock signal changes at a timing based on the synchronization clock signal and to output an edge detection signal indicating the timing at which the edge has been detected; and a clock division circuit configured to be reset at a timing based on the edge detection signal and to generate a divided clock signal by dividing the synchronization clock signal.

According to a second aspect of the invention, in the semiconductor integrated circuit according to the first aspect, the edge detection circuit may output the edge detection signal corresponding to one period of the synchronization clock signal.

According to a third aspect of the invention, the semiconductor integrated circuit according to the second aspect may further include a delay adjuster configured to delay the edge detection signal in the units of periods of the synchronization clock signal.

According to a fourth aspect of the invention, the semiconductor integrated circuit according to the third aspect may further include: a delayer configured to simulate a propagation delay in a path of the divided clock signal and to delay the divided clock signal by a time corresponding to the propagation delay; and a phase comparator configured to compare a phase of the divided clock signal delayed by the delayer with a phase of the reference clock signal.

According to a fifth aspect of the invention, in the semiconductor integrated circuit according to the fourth aspect, the delay adjuster may delay the edge detection signal by a time corresponding to a period of the synchronization clock signal which is set based on a phase comparison result from the phase comparator.

According to a sixth aspect of the invention, the semiconductor integrated circuit according to the fifth aspect may further include a fine delay adjuster configured to delay the divided clock signal by a time in one period of the synchronization clock signal, and the delayer may further delay the divided clock signal delayed by the fine delay adjuster by the time corresponding to the propagation delay.

According to a seventh aspect of the invention, in the semiconductor integrated circuit according to the sixth aspect, the fine delay adjuster may delay the divided clock signal by a time which is set based on the phase comparison result from the phase comparator.

According to an eighth aspect of the invention, the semiconductor integrated circuit according to any one of the first to seventh aspects may further include a controller configured to cause the edge detection circuit to start detection of the edge.

According to a ninth aspect of the invention, the semiconductor integrated circuit according to any one of the third to seventh aspects may further include a controller configured to cause the edge detection circuit to start detection of the edge and to set a time by which the edge detection signal is delayed in the delay adjuster.

According to a tenth aspect of the invention, the semiconductor integrated circuit according to any one of the fourth to seventh aspects may further include a controller configured to cause the edge detection circuit to start detection of the edge and to set a time by which the edge detection signal is delayed in the delay adjuster based on the phase comparison result from the phase comparator.

According to an eleventh aspect of the invention, the semiconductor integrated circuit according to the sixth or seventh aspect may further include a controller configured to cause the edge detection circuit to start detection of the edge, to set a time by which the edge detection signal is delayed in the delay adjuster based on the phase comparison result from the phase comparator, and to set a time by which the divided clock signal is delayed in the fine delay adjuster.

According to the aforementioned aspects, it is possible to provide a semiconductor integrated circuit that can curb fluctuation of a clock signal due to power supply noise which is generated in the semiconductor integrated circuit.

DETAILED DESCRIPTION OF THE PREFERRED EMBODIMENT

Hereinafter, embodiments of the invention will be described with reference to the accompanying drawings. A semiconductor integrated circuit according to the invention is based on a basic concept that fluctuation (jitter) which is generated in signal waveforms of clock signals is reduced by displacing a timing at which a level of an output signal which is output from the semiconductor integrated circuit changes (transitions) with respect to a timing at which a signal waveform of a clock signal which is input to the semiconductor integrated circuit changes (transitions). That is, the semiconductor integrated circuit according to the invention is based on a basic idea that a timing at which power supply noise (self-noise) serving as a cause of fluctuation in supply of power in a system board of a device (system) in which the semiconductor integrated circuit is mounted is generated is delayed with respect to a timing at which a level of a clock signal which is input to the semiconductor integrated circuit changes (transitions). Accordingly, in the semiconductor integrated circuit according to the invention, adjustment of displacing a phase of a clock signal which is generated based on an input clock signal and which is used in the semiconductor integrated circuit from a phase of the clock signal input to the semiconductor integrated circuit is performed. That is, in the semiconductor integrated circuit according to the invention, adjustment of delaying an operation timing of a circuit element operating in synchronization with a clock signal with respect to a timing at which the level of the clock signal input to the semiconductor integrated circuit changes (transitions) is performed.

Figure 1:
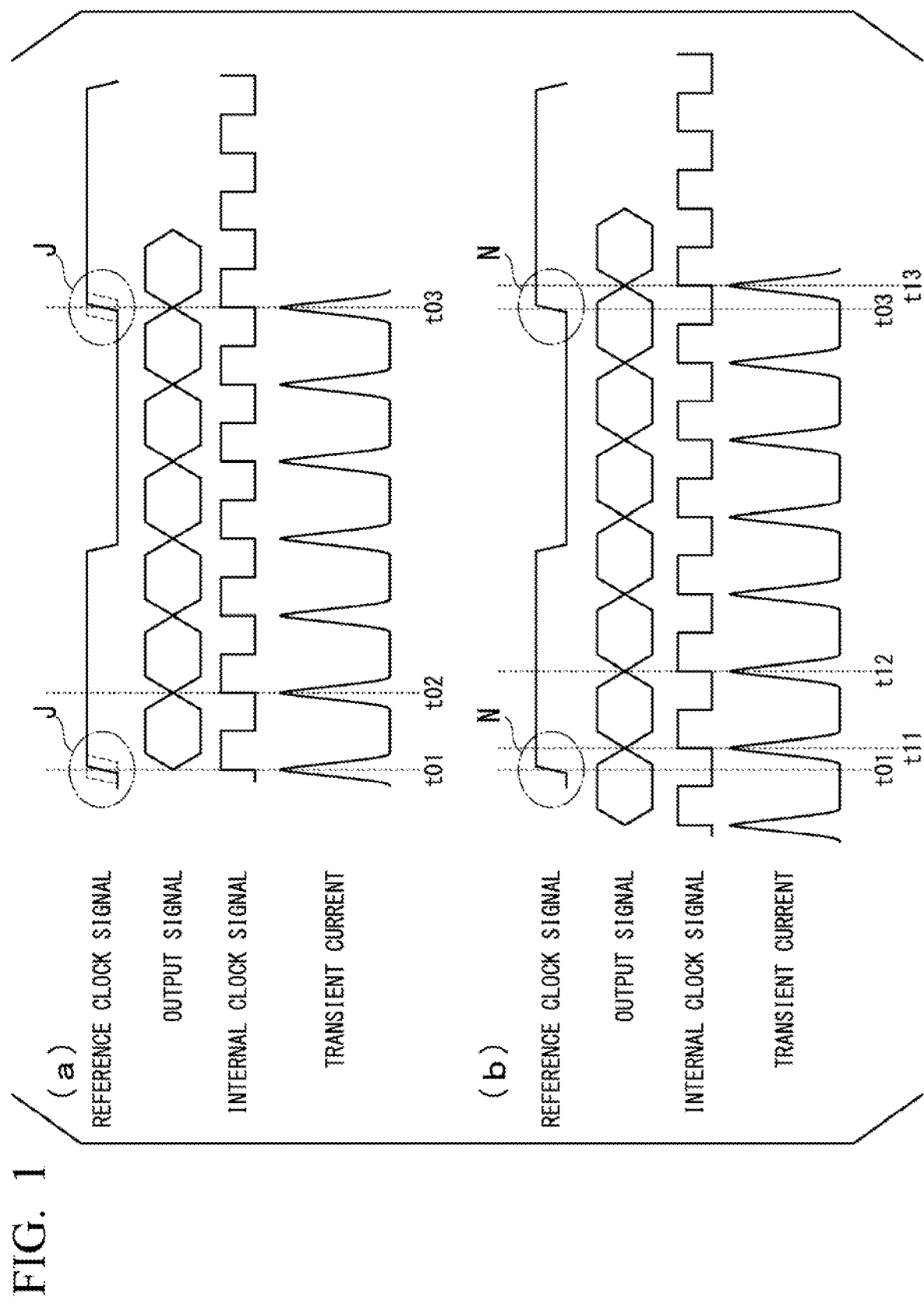
FIG. 1 is a diagram illustrating a concept of phase adjustment of a clock signal in a semiconductor integrated circuit according to the invention.

First, a basic idea of phase adjustment of a clock signal in the semiconductor integrated circuit according to the invention will be described below. FIG. 1 is a diagram illustrating a concept of phase adjustment of a clock signal in the semiconductor integrated circuit according to the invention. In FIG. 1, timings of a clock signal which is input as a reference clock signal to the semiconductor integrated circuit (hereinafter referred to as a "reference clock signal") in a device (system) in which the semiconductor integrated circuit according to the invention is mounted, parallel output signals of a plurality of bits which are output from the semiconductor integrated circuit, and a clock signal which is generated from the reference clock signal in the semiconductor integrated circuit and used in the semiconductor integrated circuit (hereinafter referred to as an "internal clock signal") are illustrated. In FIG. 1, a timing of power supply noise (self-noise) in the semiconductor integrated circuit which is generated with change (transition) of a level of an output signal is illustrated. In (a) of FIG. 1, a timing of a transient current which is generated as power supply noise when the idea of phase adjustment in the semiconductor integrated circuit according to the invention is not applied is illustrated. In (b) of FIG. 1, a timing of a transient current which is generated as power supply noise when the idea of phase adjustment in the semiconductor integrated circuit according to the invention is applied is illustrated.

First, power supply noise which is generated in the semiconductor integrated circuit when the idea of phase adjustment in the semiconductor integrated circuit according to the invention is not applied will be described below with reference to (a) of FIG. 1. In the timings illustrated in (a) of FIG. 1, the semiconductor integrated circuit generates an internal clock signal by multiplying a reference clock signal at a timing of a rising edge (time t01 or time t03) at which the level of the reference clock signal changes (transitions). Accordingly, in a semiconductor integrated circuit to which the idea of phase adjustment in the semiconductor integrated circuit according to the invention is not applied, as illustrated in (a) of FIG. 1, an output signal changes, for example, at time t01, time t02, time t03, or the like in synchronization with the rising edges of the internal clock signal.

Accordingly, in a semiconductor integrated circuit to which the idea of phase adjustment in the semiconductor integrated circuit according to the invention is not applied, as illustrated in (a) of FIG. 1, a large transient current flows at timings synchronized with the rising edges of the internal clock signal (for example, at time t01, time t02, and time t03). Accordingly, in the semiconductor integrated circuit to which the idea of phase adjustment in the semiconductor integrated circuit according to the invention is not applied, a large amount of power supply noise is generated at the timings synchronized with the rising edges of the internal clock signal (for example, at time t01, time t02, and time t03) illustrated in (a) of FIG. 1.

Then, in a device (system) in which the semiconductor integrated circuit to which the idea of phase adjustment in the semiconductor integrated circuit according to the invention is not applied is mounted, the reference clock signal fluctuates greatly due to the power supply noise generated at time t01 or time t03 and serves as a reference of the internal clock signal as illustrated in a transition period of time J of the reference clock signal in (a) of FIG. 1. That is, in a device (system) in which the semiconductor integrated circuit to which the idea of phase adjustment in the semiconductor integrated circuit according to the invention is not applied is mounted, jitter is generated at the rising edge of the reference clock signal serving as a reference of the internal clock signal.

Power supply noise which is generated in the semiconductor integrated circuit to which the idea of phase adjustment in the semiconductor integrated circuit according to the invention is applied will be described below with reference to (b) of FIG. 1. At the timings illustrated in (b) of FIG. 1, similarly to the timings illustrated in (a) of FIG. 1, the semiconductor integrated circuit generates an internal clock signal by multiplying the reference clock signal with respect to the timing of the rising edge (time t01 or time t03) at which the level of the reference clock signal changes (transitions). However, in the semiconductor integrated circuit to which the idea of phase adjustment in the semiconductor integrated circuit according to the invention is applied, as illustrated in (b) of FIG. 1, the timing of the rising edge of the internal clock signal which is generated is delayed with respect to the timing of the rising edge of the reference clock signal by setting the timing of the rising edge of the internal clock signal to time t11 or time t13. In other words, in the semiconductor integrated circuit to which the idea of phase adjustment in the semiconductor integrated circuit according to the invention is applied, the phase of the internal clock signal which is generated is displaced from the phase of the reference clock signal. Accordingly, in the semiconductor integrated circuit to which the idea of phase adjustment in the semiconductor integrated circuit according to the invention is applied, as illustrated in (b) of FIG. 1, the output signal changes, for example, at the timings such as time t11, time t12, and time t13 in synchronization with the rising edges of the internal clock signal.

In the semiconductor integrated circuit to which the idea of phase adjustment in the semiconductor integrated circuit according to the invention is applied, as illustrated in (b) of FIG. 1, a large transient current also flows at the timings (for example, time t11, time t12, and time t13) synchronized with the rising edges of the internal clock signal. That is, in the semiconductor integrated circuit to which the idea of phase adjustment in the semiconductor integrated circuit according to the invention is applied, similarly to a semiconductor integrated circuit to which the idea of phase adjustment in the semiconductor integrated circuit according to the invention is not applied, a lot of power supply noise is generated at the timings (for example, time t11, time t12, and time t13) synchronized with the rising edges of the internal clock signal.

In the semiconductor integrated circuit to which the idea of phase adjustment in the semiconductor integrated circuit according to the invention is applied, the timings of the rising edges of the internal clock signal which is generated are delayed from the timings of the rising edges of the reference clock signal as described above. Accordingly, in the semiconductor integrated circuit to which the idea of phase adjustment in the semiconductor integrated circuit according to the invention is applied, a lot of power supply noise is generated at the timings synchronized with the rising edges of the internal clock signal, but the timing at which power supply noise is generated is displaced from the timings of the rising edges of the reference clock signal which is used as a reference of the internal clock signal by setting the timing at which the power supply noise is generated to time t11 or time t13. That is, in the semiconductor integrated circuit to which the idea of phase adjustment in the semiconductor integrated circuit according to the invention is applied, unlike a semiconductor integrated circuit to which the idea of phase adjustment in the semiconductor integrated circuit according to the invention is not applied, power supply noise is generated in a period of time in which the level of the reference clock signal is stabilized at a certain level instead of a rising period of time in which the level of the reference clock signal changes (transitions). Accordingly, in the semiconductor integrated circuit to which the idea of phase adjustment in the semiconductor integrated circuit according to the invention is applied, the generated power supply noise affects the reference clock signal less.

Accordingly, in a device (system) in which the semiconductor integrated circuit to which the idea of phase adjustment in the semiconductor integrated circuit according to the invention is applied is mounted, power supply noise is not generated at time t01 or time t03, which is a reference of the internal clock signal, and the reference clock signal does not fluctuate greatly due to the power supply noise as illustrated in a transition period of time N of the reference clock signal in (b) of FIG. 1. That is, in the device (system) in which the semiconductor integrated circuit to which the idea of phase adjustment in the semiconductor integrated circuit according to the invention is applied is mounted, jitter is not generated in the rising edges of the reference clock signal which is a reference of the internal clock signal.

In this way, in the semiconductor integrated circuit to which the idea of phase adjustment in the semiconductor integrated circuit according to the invention is applied, power supply noise (self-noise) serving as a cause of fluctuation (jitter) in the rising edges of the reference clock signal is removed by delaying the timings of the rising edges of the internal clock signal which is generated based on the reference clock signal with respect to the timings of the rising edges of the reference clock signal.

First Embodiment

Figure 2:
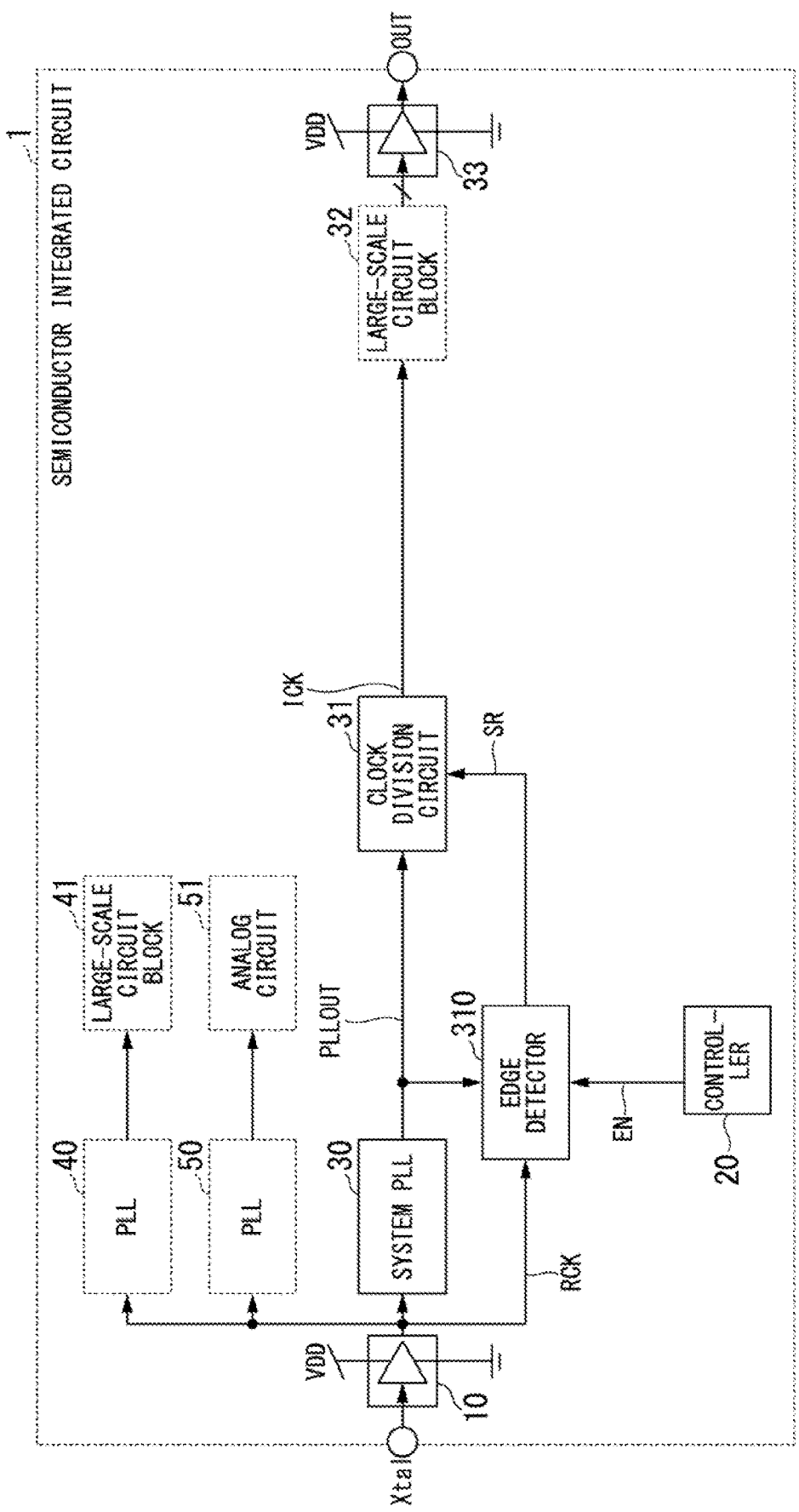
FIG. 2 is a block diagram schematically illustrating a configuration of a semiconductor integrated circuit according to a first embodiment of the invention.

A semiconductor integrated circuit according to a first embodiment of the invention will be described below. FIG. 2 is a block diagram schematically illustrating a configuration of the semiconductor integrated circuit according to the first embodiment of the invention. The semiconductor integrated circuit 1 illustrated in FIG. 2 includes a comparator 10, a controller 20, a system phase-locked loop (PLL) 30, a clock division circuit 31, an edge detection circuit 310, a large-scale circuit block 32, and an output buffer 33. The semiconductor integrated circuit 1 further includes a PLL 40, a large-scale circuit block 41, a PLL 50, and an analog circuit 51. The PLL 40, the large-scale circuit block 41, the PLL 50, and the analog circuit 51 illustrated in FIG. 2 use a reference clock signal as a common source, and are illustrated as an example of circuits which are affected by jitter performance of the reference clock signal which deteriorates due to fluctuation of power supply noise.

The semiconductor integrated circuit 1 is a large-scale semiconductor integrated circuit which is realized, for example, by an application-specific integrated circuit (ASIC). The semiconductor integrated circuit 1 realizes a predetermined function in a device (system) in which the semiconductor integrated circuit 1 is mounted. The semiconductor integrated circuit 1 is mounted on a system board constituting a system of the device and performs an operation for realizing a predetermined function in the system of the device based on a clock signal of a predetermined frequency which is output from a clock supply circuit mounted on the same system board. For example, a clock oscillation circuit such as a crystal oscillator or a crystal oscillation circuit may be conceived as the clock supply circuit which is mounted on the system board. In the following description, it is assumed that the clock supply circuit mounted on the system board of the device is a crystal oscillator and the semiconductor integrated circuit 1 operates based on a clock signal oscillated from the crystal oscillator (hereinafter referred to as an "originally oscillated clock signal Xtal").

The comparator 10 is a clock buffer circuit that shapes a waveform of the originally oscillated clock signal Xtal which is oscillated and output from the clock supply circuit (the crystal oscillator) and supplies the shaped originally oscillated clock signal Xtal to elements provided in the semiconductor integrated circuit 1. For example, the comparator 10 shapes the waveform of the sinusoidal originally oscillated clock signal Xtal to a rectangular waveform. The comparator 10 supplies the shaped originally oscillated clock signal Xtal (hereinafter referred to as a "reference clock signal RCK") to the system PLL 30, the edge detection circuit 310, the PLL 40, and the PLL 50.

The controller 20 is a controller that controls performing of phase adjustment of a clock signal which is used for operation of elements provided in the semiconductor integrated circuit 1. The controller 20 outputs a phase adjustment enable signal EN to the edge detection circuit 310 at the time of performing phase adjustment of a clock signal.

The controller 20 is also a controller that controls all the functions provided in the semiconductor integrated circuit 1 in order to realize the predetermined function in the system of the device. The controller 20 is a process such as a central processing unit (CPU). The controller 20 controls all the functions provided in the semiconductor integrated circuit 1 based on a program or data for controlling elements provided in the semiconductor integrated circuit 1. The controller 20 may control other elements which are provided in the system of the device and mounted on the same system board. The program or data which is used for the controller 20 to control the functions provided in the semiconductor integrated circuit 1 or the elements provided in the system of the device may be stored, for example, in a storage device such as a memory which is not illustrated. In this case, the controller 20 controls all functions provided in the semiconductor integrated circuit 1 or the elements provided in the system of the device by reading the program or data stored in the memory and executing the read program or data. The controller 20 is not limited to the configuration in which the controller is provided in the semiconductor integrated circuit 1, and may be provided outside of the semiconductor integrated circuit 1, that is, may be mounted on the same system board.

The system PLL 30 is a phase synchronization circuit that generates a synchronization clock signal PLLOUT synchronized with the reference clock signal RCK which is output from the comparator 10. The system PLL 30 generates a synchronization clock signal PLLOUT by multiplying the reference clock signal RCK by an integer, that is, a synchronization clock signal PLLOUT of a frequency higher than the frequency of the reference clock signal RCK. Then, the system PLL 30 outputs the generated synchronization clock signal PLLOUT to the clock division circuit 31 and the edge detection circuit 310.

The edge detection circuit 310 detects a rising edge of the reference clock signal RCK output from the comparator 10 under the control of the controller 20. The edge detection circuit 310 outputs a signal indicating a timing at which the rising edge of the reference clock signal RCK has been detected to the clock division circuit 31. More specifically, when the phase adjustment enable signal EN is output from the controller 20, the edge detection circuit 310 detects a first rising edge in the reference clock signal RCK at a timing of a rising edge of the synchronization clock signal PLLOUT. The edge detection circuit 310 outputs the signal indicating the timing at which the rising edge of the reference clock signal RCK has been detected as a synchronization reset signal SR for resetting the clock division circuit 31 in synchronization with the rising edge of the reference clock signal RCK to the clock division circuit 31.

The clock division circuit 31 is a clock division circuit that divides the synchronization clock signal PLLOUT output from the system PLL 30 and generates an internal clock signal ICK for operation of the circuit elements in the corresponding large-scale circuit block 32. The clock division circuit 31 generates the internal clock signal ICK by dividing the synchronization clock signal PLLOUT by a predetermined division ratio. The clock division circuit 31 outputs the generated internal clock signal ICK to the circuit elements in the large-scale circuit block 32.

The operation of dividing the synchronization clock signal PLLOUT in the clock division circuit 31 is reset by the synchronization reset signal SR which is output from the edge detection circuit 310. In other words, the clock division circuit 31 starts generation of the internal clock signal ICK at a timing at which the synchronization reset signal SR is released. Accordingly, the internal clock signal ICK which is generated by the clock division circuit 31 is a clock signal which is synchronized with the timing of the first rising edge of the reference clock signal RCK detected by the edge detection circuit 310 after the controller 20 has output the phase adjustment enable signal EN to the edge detection circuit 310.

The large-scale circuit block 32 is a digital circuit element group for realizing the predetermined function in the semiconductor integrated circuit 1 at a timing based on the clock of the internal clock signal ICK output from the clock division circuit 31. The circuit elements provided in the large-scale circuit block 32 realize the predetermined function at a timing synchronized with the internal clock signal ICK. The large-scale circuit block 32 outputs a signal indicating a result of realization of the predetermined function to the output buffer 33 at a timing synchronized with the internal clock signal ICK. In FIG. 2, the configuration in which the large-scale circuit block 32 outputs parallel signals of a plurality of bits indicating the result of realization of the predetermined function to the output buffer 33 is illustrated.

The output buffer 33 is a buffer circuit that outputs the signal indicating the result of realization of the predetermined function in the large-scale circuit block 32 as an output signal OUT in the semiconductor integrated circuit 1 to the outside of the semiconductor integrated circuit 1. As described above, the large-scale circuit block 32 outputs the parallel signals of a plurality of bits indicating the result of realization of the predetermined function to the output buffer 33 at a timing synchronized with the internal clock signal ICK. Accordingly, the output buffer 33 also outputs the parallel output signals OUT of a plurality of bits to the outside of the semiconductor integrated circuit 1. Accordingly, in the semiconductor integrated circuit 1, there is concern about change (transition) in level of the output signal OUT output from the output buffer 33 serving as a cause of power supply noise (self-noise) which is generated in the semiconductor integrated circuit 1. However, in the semiconductor integrated circuit 1, phase adjustment of displacing the phase of the internal clock signal ICK which is generated by the clock division circuit 31 from the phase of the reference clock signal RCK is performed as described above. Accordingly, in the semiconductor integrated circuit 1, power supply noise (self-noise) based on change (transition) in level of the output signal OUT does not serve as a cause for generation of jitter at the rising edge of the originally oscillated clock signal Xtal oscillated from the clock supply circuit (crystal oscillator) or the reference clock signal RCK output from the comparator 10. Details of the operation of adjusting the phase of the internal clock signal ICK in the semiconductor integrated circuit 1 will be described later.

The PLL 40 is a phase synchronization circuit that generates a PLL clock signal which is synchronized with the reference clock signal RCK output from the comparator 10 like the system PLL 30. The PLL 40 outputs the generated PLL clock signal to the large-scale circuit block 41. That is, the PLL 40 is a phase synchronization circuit corresponding to a clock path other than that of the system PLL 30.

The large-scale circuit block 41 is a digital circuit element group for realizing the predetermined function in the semiconductor integrated circuit 1 at a timing of a clock signal based on the PLL clock signal output from the PLL 40. The circuit elements provided in the large-scale circuit block 41 realize the predetermined function at a timing synchronized with the PLL clock signal output from the PLL 40.

For the purpose of easy description, a path (a signal line) for outputting the result of realization of the predetermined function from the large-scale circuit block 41 is not illustrated in FIG. 2. However, it is conceivable that the semiconductor integrated circuit 1 has a configuration in which the large-scale circuit block 41 outputs the result of realization of the predetermined function as an output signal to the outside of the semiconductor integrated circuit 1 similarly to the large-scale circuit block 32. In this case, the large-scale circuit block 41 outputs a signal indicating the result of realization of the predetermined function to a corresponding output buffer which is not illustrated. Accordingly, the output signal indicating the result of realization of the predetermined function in the large-scale circuit block 41 is output from the output buffer which is not illustrated. Then, change (transition) in level of the output signal which is output from the output buffer (not illustrated) corresponding to the large-scale circuit block 41 to the outside of the semiconductor integrated circuit 1 also serves as a cause of power supply noise (self-noise) which is generated in the semiconductor integrated circuit 1. In this case, the semiconductor integrated circuit 1 may include an element that adjusts the phase of the clock signal which is used for operation of the circuit elements provided in the large-scale circuit block 41, that is, the clock signal based on the PLL clock signal output from the PLL 40, similarly to the internal clock signal ICK based on the synchronization clock signal PLLOUT output from the system PLL 30. That is, the semiconductor integrated circuit 1 may include an element that performs the same operation as the edge detection circuit 310 or the clock division circuit 31 to generate the clock signal based on the PLL clock signal output from the PLL 40. Accordingly, in the semiconductor integrated circuit 1, power supply noise (self-noise) due to change (transition) in level of the output signal which is output at the timing of the clock signal based on the PLL clock signal output from the PLL 40 does not serve as a cause of generation of jitter at a rising edge of the originally oscillated clock signal Xtal oscillated from the clock supply circuit (crystal oscillator) or the reference clock signal RCK output from the comparator 10.

The PLL 50 is a phase synchronization circuit that generates a PLL clock signal which is synchronized with the reference clock signal RCK output from the comparator 10 similarly to the system PLL 30. Here, the PLL 50 outputs the generated PLL clock signal to the analog circuit 51. That is, the PLL 50 is a phase synchronization circuit corresponding to a clock path other than that of the system PLL 30 or the PLL 40.

The analog circuit 51 is an analog circuit element group that realizes a predetermined function in the semiconductor integrated circuit 1 at a timing of a clock signal based on the PLL clock signal output from the PLL 50. The circuit elements provided in the analog circuit 51 realize the predetermined function at a timing synchronized with the PLL clock signal output from the PLL 50.

For the purpose of easy description, a path (a signal line) for outputting the result of realization of the predetermined function in the analog circuit 51 is not illustrated in FIG. 2 similarly to the clock path of the large-scale circuit block 41. However, similarly to the large-scale circuit block 32 or the large-scale circuit block 41, it is conceivable that the semiconductor integrated circuit 1 has a configuration in which the result of realization of the predetermined function in the analog circuit 51 is output as an output signal to the outside of the semiconductor integrated circuit 1. In this case, the analog circuit 51 outputs a signal indicating the result of realization of the predetermined function to a corresponding output buffer which is not illustrated. Accordingly, the output signal indicating the result of realization of the predetermined function in the analog circuit 51 is output from the output buffer which is not illustrated. Then, change (transition) in level of the output signal which is output from the output buffer (not illustrated) corresponding to the analog circuit 51 to the outside of the semiconductor integrated circuit 1 also serves as a cause of power supply noise (self-noise) which is generated in the semiconductor integrated circuit 1. In this case, the semiconductor integrated circuit 1 may include an element that adjusts the phase of the clock signal which is used for operation of the circuit elements provided in the analog circuit 51, that is, the clock signal based on the PLL clock signal output from the PLL 50, similarly to the internal clock signal ICK based on the synchronization clock signal PLLOUT output from the system PLL 30. That is, the semiconductor integrated circuit 1 may include an element that performs the same operation as the edge detection circuit 310 or the clock division circuit 31 to generate the clock signal based on the PLL clock signal output from the PLL 50. Accordingly, in the semiconductor integrated circuit 1, power supply noise (self-noise) due to change (transition) in level of the output signal which is output at the timing of the clock signal based on the PLL clock signal output from the PLL 50 does not serve as a cause of generation of jitter at a rising edge of the originally oscillated clock signal Xtal oscillated from the clock supply circuit (crystal oscillator) or the reference clock signal RCK output from the comparator 10.

Figure 3:
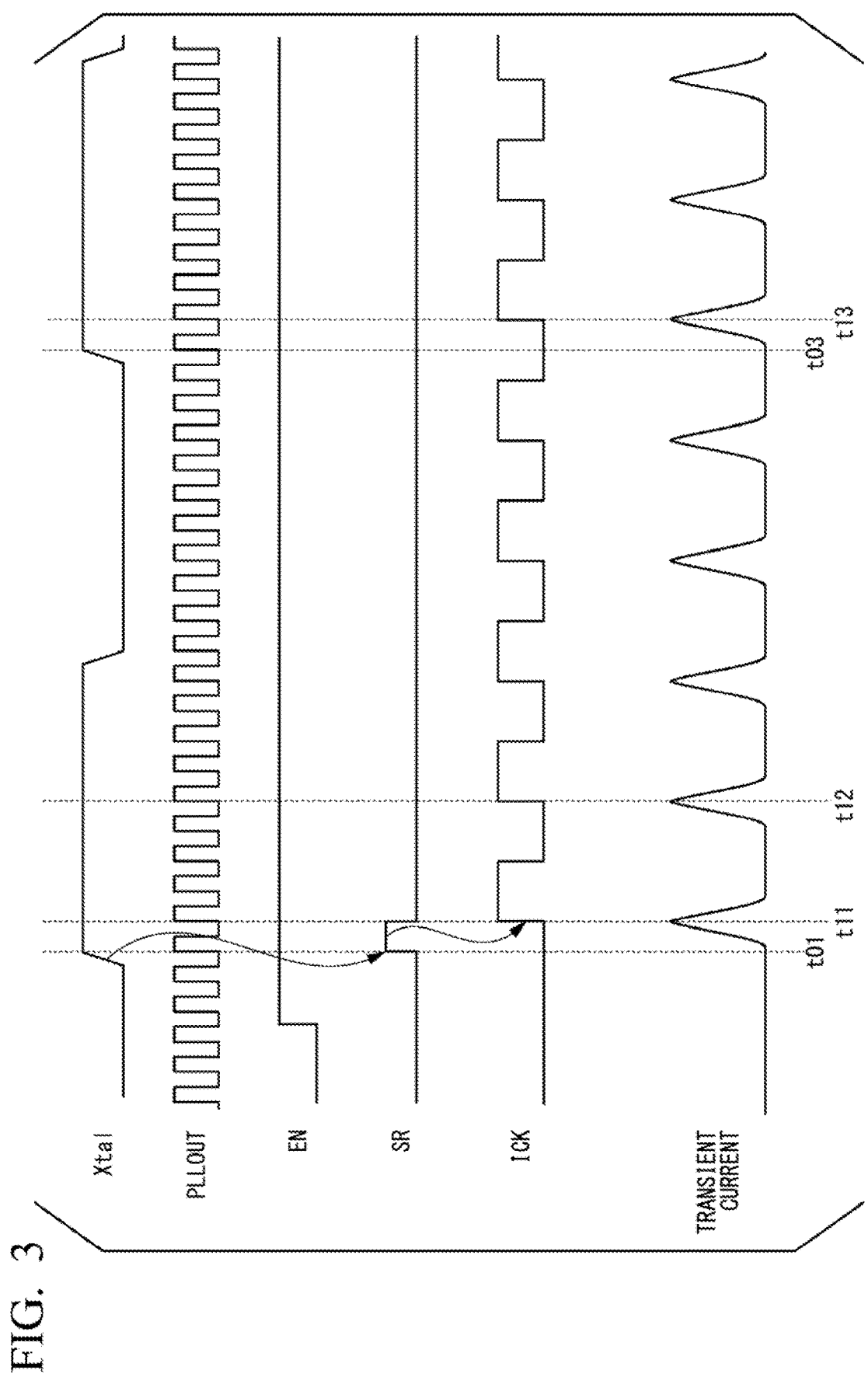
FIG. 3 is a timing chart illustrating a phase adjustment operation in the semiconductor integrated circuit according to the first embodiment of the invention.

The operation of adjusting the phase of the internal clock signal ICK which is used for operation of the circuit elements in the large-scale circuit block 32 provided in the semiconductor integrated circuit 1 will be described below. FIG. 3 is a timing chart illustrating the phase adjustment operation in the semiconductor integrated circuit 1 according to the first embodiment of the invention. In FIG. 3, timings of signals which are output from elements in the clock path of the internal clock signal ICK in the semiconductor integrated circuit 1 are illustrated. More specifically, the timings of the originally oscillated clock signal Xtal, the synchronization clock signal PLLOUT, the phase adjustment enable signal EN, the synchronization reset signal SR, and the internal clock signal ICK are illustrated. The timing of the originally oscillated clock signal Xtal illustrated in FIG. 3 is also the timing of the reference clock signal RCK at which the edge detection circuit 310 detects a rising edge. In the following description, it is assumed that the edge detection circuit 310 detects a rising edge of the originally oscillated clock signal Xtal. In FIG. 3, a timing of a transient current is illustrated as a timing of power supply noise (self-noise) which is generated at a timing based on the internal clock signal ICK in the semiconductor integrated circuit 1.

In the semiconductor integrated circuit 1, the phase adjustment operation is started when the system board of the device is powered on and the controller 20 is started. At this time, the controller 20 first sets the phase adjustment enable signal EN to a "high" level. Accordingly, the edge detection circuit 310 detects a rising edge of an originally oscillated clock signal Xtal based on the "high" level of the phase adjustment enable signal EN. In FIG. 3, the operation when the edge detection circuit 310 detects the rising edge of the originally oscillated clock signal Xtal at time t01 is illustrated.

When the rising edge of the originally oscillated clock signal Xtal is detected at time t01, the edge detection circuit 310 outputs a synchronization reset signal SR corresponding to one period of a synchronization clock signal PLLOUT to the clock division circuit 31. That is, the edge detection circuit 310 sets the synchronization reset signal SR to a "high" level at time t01 and then sets the synchronization reset signal SR to a "low" level at time t11. Accordingly, the division operation of the clock division circuit 31 is reset based on the "high" level of the synchronization reset signal SR output from the edge detection circuit 310, and the clock division circuit 31 starts outputting an internal clock signal ICK into which the synchronization clock signal PLLOUT is divided at time t11 at which the synchronization reset signal SR is switched to the "low" level, that is, reset is released. Accordingly, the internal clock signal ICK output from the clock division circuit 31 is a clock signal of which the phase corresponding to one period of the synchronization clock signal PLLOUT is displaced from the timing of the rising edge of the originally oscillated clock signal Xtal detected by the edge detection circuit 310. The internal clock signal ICK illustrated in FIG. 3 is an example in which the synchronization clock signal PLLOUT is divided into five in frequency. That is, the frequency of the internal clock signal ICK illustrated in FIG. 3 is ⅕ times the frequency of the synchronization clock signal PLLOUT.

In the semiconductor integrated circuit 1, a signal which is output to the outside by the output buffer 33 by causing the large-scale circuit block 32 to operate to realize the predetermined function is a signal of which the phase corresponding to one period of the synchronization clock signal PLLOUT is displaced from the timing of the rising edge of the originally oscillated clock signal Xtal and of which the level changes (transitions), for example, at time t11, time t12, and time t13. Accordingly, in the system board of the device, a large transient current flows, for example, at time t11, time t12, and time t13 as illustrated in FIG. 3 with change (transition) in level of the output signal OUT which is output in synchronization with the rising edges of the internal clock signal ICK output in the semiconductor integrated circuit 1. That is, in the system board of the device, power supply noise synchronized with the output signal OUT output in the semiconductor integrated circuit 1 is generated at a timing at which the phase is displaced by one period of the synchronization clock signal PLLOUT from a timing of a rising edge of the originally oscillated clock signal Xtal.

In other words, in the system board of the device, power supply noise generated in the semiconductor integrated circuit 1 is generated in a period of time in which the level of the originally oscillated clock signal Xtal or the reference clock signal RCK is stabilized at a certain level instead of the timing of time t01 or time t03 while the level of the originally oscillated clock signal Xtal or the reference clock signal is changing (transitioning). Accordingly, in the system board of the device, power supply noise generated in the semiconductor integrated circuit 1 affects the originally oscillated clock signal Xtal or the reference clock signal RCK less and does not serve as a cause of generation of jitter at the rising edge of the originally oscillated clock signal Xtal or the reference clock signal RCK.

In this way, in the semiconductor integrated circuit 1, the edge detection circuit 310 detects a rising edge of the reference clock signal RCK and resets the clock division circuit 31. Accordingly, in the semiconductor integrated circuit 1, the timing of the rising edge of the internal clock signal ICK which is generated based on the reference clock signal RCK (the originally oscillated clock signal Xtal) is displaced from the timing of the rising edge of the reference clock signal RCK (the originally oscillated clock signal Xtal). Accordingly, in the semiconductor integrated circuit 1, a timing of power supply noise (self-noise) which is generated in the system board of the device due to change (transition) in level of an output signal OUT which is output to the outside is displaced from the timing of the rising edge of the reference clock signal RCK (the originally oscillated clock signal Xtal). Accordingly, in the semiconductor integrated circuit 1, even when power supply noise (self-noise) is generated, the power supply noise does not serve as a cause of fluctuation of the rising edge (generation of jitter) of the reference clock signal RCK (the originally oscillated clock signal Xtal). In other words, in the semiconductor integrated circuit 1, power supply noise (self-noise) serving as a cause of generation of fluctuation (jitter) of the rising edge of the reference clock signal RCK (the originally oscillated clock signal Xtal) is removed.

According to the first embodiment, a semiconductor integrated circuit (the semiconductor integrated circuit 1) is provided, including: a phase synchronization circuit (the system PLL 30) that generates a synchronization clock signal (the synchronization clock signal PLLOUT) which is synchronized with a reference clock signal (which may be the reference clock signal RCK or the originally oscillated clock signal Xtal) by multiplying the reference clock signal RCK; an edge detection circuit (the edge detection circuit 310) configured to detect an edge (a rising edge in the first embodiment) at which a signal waveform of the reference clock signal RCK changes at a timing of the synchronization clock signal PLLOUT and to output an edge detection signal (the edge detection signal ED) indicating the timing at which the rising edge has been detected; and a clock division circuit (the clock division circuit 31) configured to be reset at a timing based on the edge detection signal ED and to generate a divided clock signal (the internal clock signal ICK) by dividing the synchronization clock signal PLLOUT.

According to the first embodiment, the semiconductor integrated circuit 1 is configured such that the edge detection circuit 310 outputs the edge detection signal ED corresponding to one period of the synchronization clock signal PLLOUT.

According to the first embodiment, the semiconductor integrated circuit 1 is configured to further include a controller (the controller 20) configured to cause the edge detection circuit 310 to start detection of the rising edge.

As described above, in the semiconductor integrated circuit 1 according to the first embodiment, the edge detection circuit 310 displaces the timing of the rising edge of the internal clock signal ICK generated by the clock division circuit 31 from the timing of the rising edge of the reference clock signal RCK (the originally oscillated clock signal Xtal) by detecting the rising edge of the reference clock signal RCK and resetting the clock division circuit 31. Accordingly, in the semiconductor integrated circuit 1 according to the first embodiment, even when power supply noise (self-noise) is generated in the system board of the device (system) in which the semiconductor integrated circuit 1 according to the first embodiment is mounted due to change (transition) in level of the output signal OUT which is output to the outside, the timing at which the power supply noise (self-noise) is generated is displaced form the timing of the rising edge of the reference clock signal RCK (the originally oscillated clock signal Xtal). As a result, in the semiconductor integrated circuit 1 according to the first embodiment, the generated power supply noise (self-noise) does not serve as a cause of fluctuation (generation of jitter) of the rising edge of the reference clock signal RCK (the originally oscillated clock signal Xtal). That is, in the semiconductor integrated circuit 1 according to the first embodiment, generation of power supply noise (self-noise) at a timing at which fluctuation (jitter) of the rising edge of the reference clock signal RCK (the originally oscillated clock signal Xtal) is generated is prevented.

Accordingly, in the device (system) in which the semiconductor integrated circuit 1 according to the first embodiment is mounted, it is possible to curb deterioration in performance of the system as a whole due to power supply noise (self-noise) which is generated in the semiconductor integrated circuit 1 according to the first embodiment.

In the semiconductor integrated circuit 1 according to the first embodiment, the configuration in which the phase of the internal clock signal ICK which is generated by the clock division circuit 31 is displaced by one period of the synchronization clock signal PLLOUT from the timing of the rising edge of the reference clock signal RCK (the originally oscillated clock signal Xtal) using the synchronization reset signal SR which is output from the edge detection circuit 310 has been described above. However, an amount by which the timing of the rising edge of the internal clock signal ICK generated by the clock division circuit 31 in the semiconductor integrated circuit 1 according to the first embodiment is delayed from the timing of the rising edge of the reference clock signal RCK (the originally oscillated clock signal Xtal), that is, a phase adjustment amount of the internal clock signal ICK, is not limited to one period of the synchronization clock signal PLLOUT. For example, in the semiconductor integrated circuit 1 according to the first embodiment, it is considered that there is a propagation delay in a clock path of the internal clock signal ICK. More specifically, in the semiconductor integrated circuit 1 according to the first embodiment, it is considered that there is a propagation delay due to arrangement of the circuit elements of the large-scale circuit block 32 when a signal line of the internal clock signal ICK output from the clock division circuit 31 is wired in the circuit elements. Accordingly, in the semiconductor integrated circuit 1 according to the first embodiment, a configuration in which the phase of the internal clock signal ICK is adjusted at a timing based on the propagation delay of the internal clock signal ICK may be employed.

Second Embodiment

A semiconductor integrated circuit according to a second embodiment of the invention will be described below. The semiconductor integrated circuit according to the second embodiment of the invention employs a configuration in which the phase of the internal clock signal ICK is adjusted at a timing based on a propagation delay of the internal clock signal ICK in consideration of the propagation delay in the clock path of the internal clock signal ICK.

Figure 4:
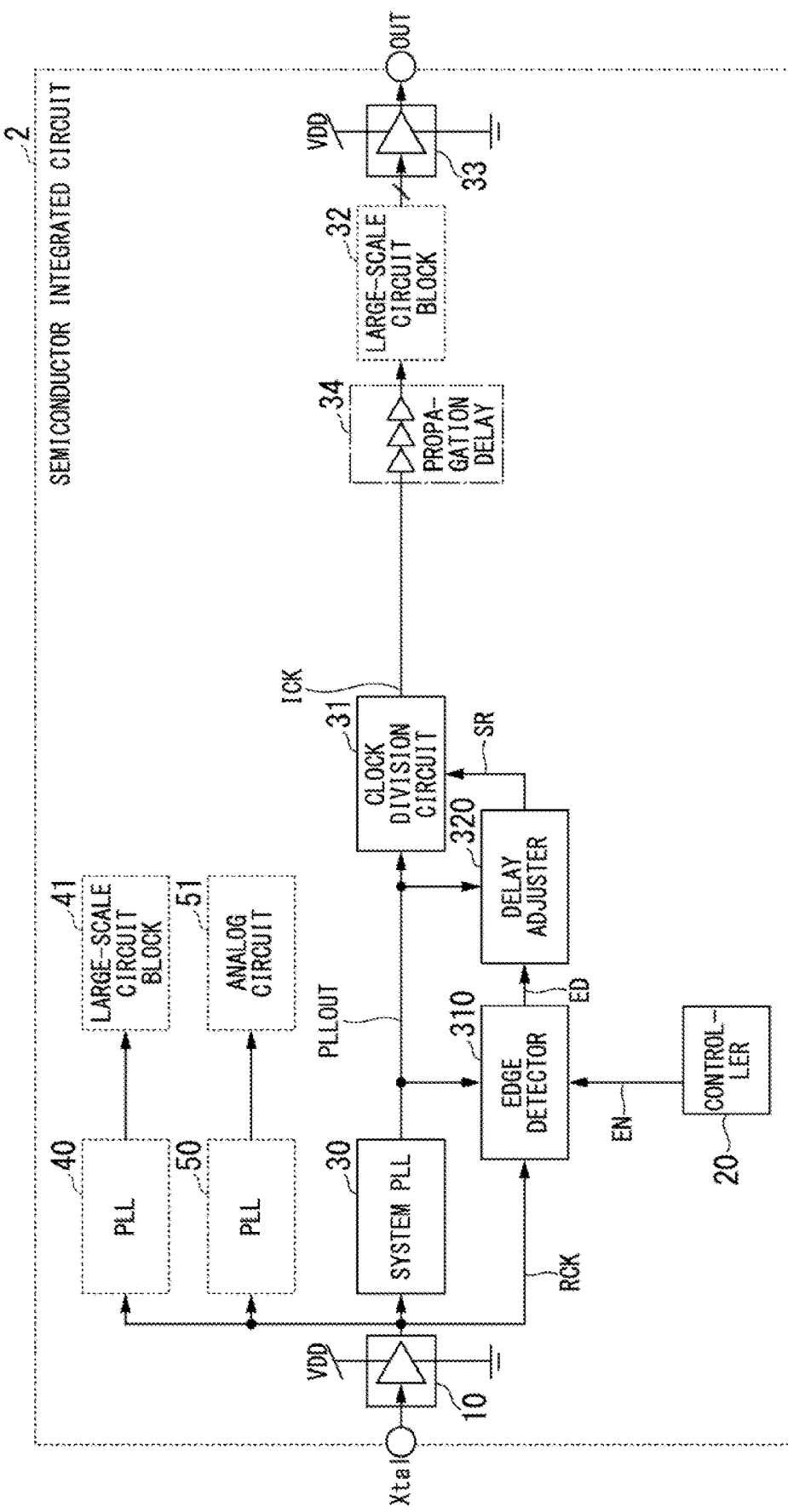
FIG. 4 is a block diagram schematically illustrating a configuration of a semiconductor integrated circuit according to a second embodiment of the invention.

FIG. 4 is a block diagram schematically illustrating the configuration of the semiconductor integrated circuit according to the second embodiment of the invention. The configuration of the semiconductor integrated circuit according to the second embodiment illustrated in FIG. 4 includes the same elements as in the semiconductor integrated circuit 1 according to the first embodiment illustrated in FIG. 2. Accordingly, out of the elements of the semiconductor integrated circuit according to the second embodiment, the same elements as the elements of the semiconductor integrated circuit 1 according to the first embodiment will be referred to by the same reference signs and detailed description thereof will be omitted.

The semiconductor integrated circuit 2 illustrated in FIG. 4 includes a comparator 10, a controller 20, a system PLL 30, a clock division circuit 31, an edge detection circuit 310, a delay adjuster 320, a large-scale circuit block 32, and an output buffer 33. In the semiconductor integrated circuit 2, the delay adjuster 320 is added between the edge detection circuit 310 and the clock division circuit 31 in the semiconductor integrated circuit 1 according to the first embodiment. In the configuration of the semiconductor integrated circuit 2 illustrated in FIG. 4, a propagation delay in a clock path of an internal clock signal ICK is schematically illustrated as a propagation delay 34 in a configuration in which a plurality of buffer circuits are connected in series. The semiconductor integrated circuit 2 further includes a PLL 40, a large-scale circuit block 41, a PLL 50, and an analog circuit 51.

Similarly to the semiconductor integrated circuit 1 according to the first embodiment illustrated in FIG. 2, the semiconductor integrated circuit 2 is a large-scale semiconductor integrated circuit which is realized, for example, by an ASIC. Similarly to the semiconductor integrated circuit 1 according to the first embodiment, the semiconductor integrated circuit 2 realizes a predetermined function in a device (system) in which the semiconductor integrated circuit 2 is mounted. Similarly to the semiconductor integrated circuit 1 according to the first embodiment, the semiconductor integrated circuit 2 is mounted on a system board constituting a system of the device and performs an operation for realizing the predetermined function in the system of the device based on a clock signal of a predetermined frequency which is output from a clock supply circuit mounted on the same system board. In the following description, similarly to the first embodiment, it is assumed that the clock supply circuit mounted on the system board of the device is a crystal oscillator and the semiconductor integrated circuit 2 operates based on an originally oscillated clock signal Xtal which is oscillated from the crystal oscillator.

In the semiconductor integrated circuit 2, the system PLL 30 outputs a generated synchronization clock signal PLLOUT to the delay adjuster 320 in addition to the clock division circuit 31 and the edge detection circuit 310.

In the semiconductor integrated circuit 2, the edge detection circuit 310 outputs a signal indicating the timing at which the rising edge of the reference clock signal RCK has been detected as an edge detection signal ED to the delay adjuster 320. The edge detection signal ED which is output from the edge detection circuit 310 to the delay adjuster 320 is the same signal as the synchronization reset signal SR in the first embodiment. That is, the edge detection circuit 310 outputs the synchronization reset signal SR as the edge detection signal ED to the delay adjuster 320.

The delay adjuster 320 delays the edge detection signal ED output from the edge detection circuit 310 by a predetermined time. More specifically, when a period of the internal clock signal ICK is TICK and a delay time of the propagation delay 34 in the clock path is TDICK, the delay adjuster 320 delays the edge detection signal ED by a time (TICK-TDICK). The delay adjuster 320 outputs the delayed edge detection signal ED as a synchronization reset signal SR to the clock division circuit 31. More specifically, the delay adjuster 320 outputs the synchronization reset signal SR obtained by delaying the edge detection signal ED output from the edge detection circuit 310 in the units of the period of the synchronization clock signal PLLOUT as the same signal as the synchronization reset signal SR in the first embodiment to the clock division circuit 31. Accordingly, in the semiconductor integrated circuit 2, the timing at which the clock division circuit 31 is reset according to the synchronization reset signal SR is delayed by the delay time in the delay adjuster 320, that is, by the time (TICK-TDICK), with respect to the clock division circuit 31 provided in the semiconductor integrated circuit 1 according to the first embodiment.

The delay adjuster 320 is not limited to the configuration with a delay of the time corresponding to the time (TICK-TDICK), that is, the configuration in which the synchronization reset signal SR obtained by delaying the edge detection signal ED by a fixed delay time is output. For example, the delay adjuster 320 may employ a configuration in which the time by which the edge detection signal ED is delayed and output as the synchronization reset signal SR can be changed under the control of the controller 20. That is, the delay adjuster 320 may be configured to change a phase adjustment amount of the internal clock signal ICK. Accordingly, it is possible to change the phase adjustment amount of the internal clock signal ICK in consideration of the timing at which power supply noise (self-noise) having a possibility of change according to arrangement positions of the elements on the system board of the device in which the semiconductor integrated circuit 2 is mounted is generated.

In the semiconductor integrated circuit 2, the internal clock signal ICK which is generated by the clock division circuit 31 is a clock signal which is synchronized with the timing of the first rising edge of the reference clock signal RCK detected by the edge detection circuit 310 after the controller 20 has output the phase adjustment enable signal EN to the edge detection circuit 310. In the semiconductor integrated circuit 2, since the delay adjuster 320 delays the timing of the synchronization reset signal SR as described above, the internal clock signal ICK generated by the clock division circuit 31 is a clock signal of which the phase is displaced by a plurality of periods of the synchronization clock signal PLLOUT.

Accordingly, in the semiconductor integrated circuit 2, the level of the output signal OUT which is output from the output buffer 33 also changes (transitions) at a timing which is delayed by a plurality of periods of the synchronization clock signal PLLOUT which has been delayed by the delay adjuster 320. In the semiconductor integrated circuit 2, similarly to the semiconductor integrated circuit 1 according to the first embodiment, power supply noise (self-noise) due to change (transition) in level of the output signal OUT does not serve as a cause of generation of jitter in the rising edge of the originally oscillated clock signal Xtal which is oscillated from the clock supply circuit (the crystal oscillator) or the reference clock signal RCK which is output from the comparator 10. On the other hand, in the semiconductor integrated circuit 2, since the level of the output signal OUT changes (transitions) at a timing in which the propagation delay in the clock path of the internal clock signal ICK in the large-scale circuit block 32 is more reflected, it is possible to more suitably curb jitter which may be generated at the rising edge of the originally oscillated clock signal Xtal or the reference clock signal RCK. Details of the phase adjustment operation for the internal clock signal ICK in the semiconductor integrated circuit 2 will be described later.

Figure 5:
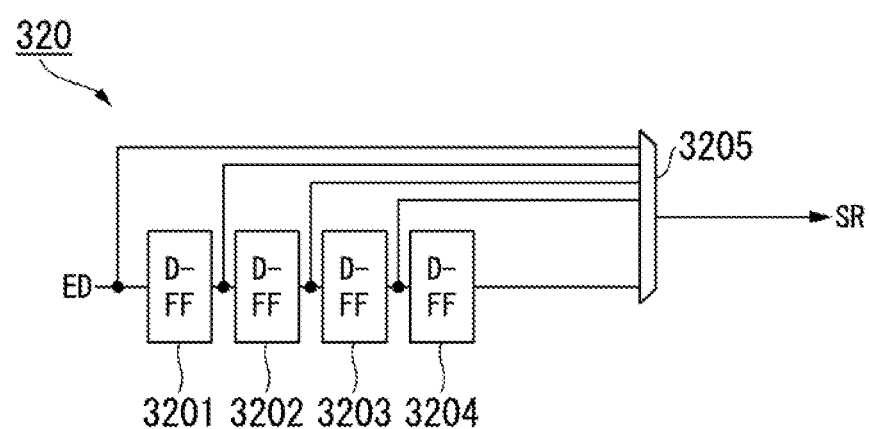
FIG. 5 is a block diagram schematically illustrating an example of a configuration of a delay adjuster which is provided in the semiconductor integrated circuit according to the second embodiment of the invention.

An example of a configuration of the delay adjuster 320 will be described below. FIG. 5 is a block diagram schematically illustrating an example of a configuration of the delay adjuster 320 which is provided in the semiconductor integrated circuit 2 according to the second embodiment of the invention. The example of the configuration of the delay adjuster 320 illustrated in FIG. 5 is an example of a configuration in which the time by which the edge detection signal ED is delayed can be changed, that is, the phase adjustment amount of the internal clock signal ICK can be changed.

The delay adjuster 320 includes four D-type flip-flops (D-FFs) 3201 to 3204 and a selector 3205. In the delay adjuster 320, the D-FF 3201, the D-FF 3202, the D-FF 3203, and the D-FF 3204 are sequentially connected in this order, and the edge detection signal ED input to the delay adjuster 320 and output signals of the D-type flip-flops are connected as input signals to the selector 3205. In the delay adjuster 320, an input signal selected by the selector 3205 is output as the synchronization reset signal SR.

In the delay adjuster 320, each D-type flip-flop receives and holds the edge detection signal ED input thereto or the output signal of the D-type flip-flop in the preceding stage every period of the synchronization clock signal PLLOUT. In the delay adjuster 320, for example, the selector 3205 selects the edge detection signal ED or one signal of the output signals of the four D-type flip-flops under the control of the controller 20 and outputs the selected signal as the synchronization reset signal SR.

With this configuration, the delay adjuster 320 outputs the edge detection signal ED output from the edge detection circuit 310 without any change or the edge detection signal ED delayed by one to four periods of the synchronization clock signal PLLOUT as the synchronization reset signal SR to the clock division circuit 31 under the control of the controller 20. Accordingly, in the semiconductor integrated circuit 2, the phase of the internal clock signal ICK generated by the clock division circuit 31 is displaced by one to five periods of the synchronization clock signal PLLOUT from the timing of the rising edge of the reference clock signal RCK (the originally oscillated clock signal Xtal) using the synchronization reset signal SR output from the delay adjuster 320.

FIG. 5 illustrates the configuration of the delay adjuster 320 that outputs the edge detection signal ED with a delay of 0 to four periods of the synchronization clock signal PLLOUT, but the configuration of the delay adjuster 320 is not limited to the configuration illustrated in FIG. 5. For example, the delay adjuster 320 may employ a configuration in which a number of D-type flip-flops corresponding to one period of the reference clock signal RCK, that is, one period of the originally oscillated clock signal Xtal are provided. With this configuration, the delay adjuster 320 can delay the edge detection signal ED at any timing of one period of the reference clock signal RCK and output the delayed signal as the synchronization reset signal SR under the control of the controller 20. Accordingly, even when the semiconductor integrated circuit 2 is mounted in various devices, it is possible to suitably change the phase adjustment amount of the internal clock signal ICK. The delay adjuster 320 may have any configuration as long as it can delay an edge detection signal ED and output the delayed signal as a synchronization reset signal SR.

When the delay adjuster 320 does not change a delay time of the edge detection signal ED, that is, when the delay adjuster 320 has a configuration in which the phase adjustment amount of the internal clock signal ICK is fixed, the delay adjuster 320 may not include the selector 3205 and be configured to output the output signal of the D-type flip-flop in the final stage (the D-FF 3204 in FIG. 5) as a synchronization reset signal SR to the clock division circuit 31.

Figure 6:
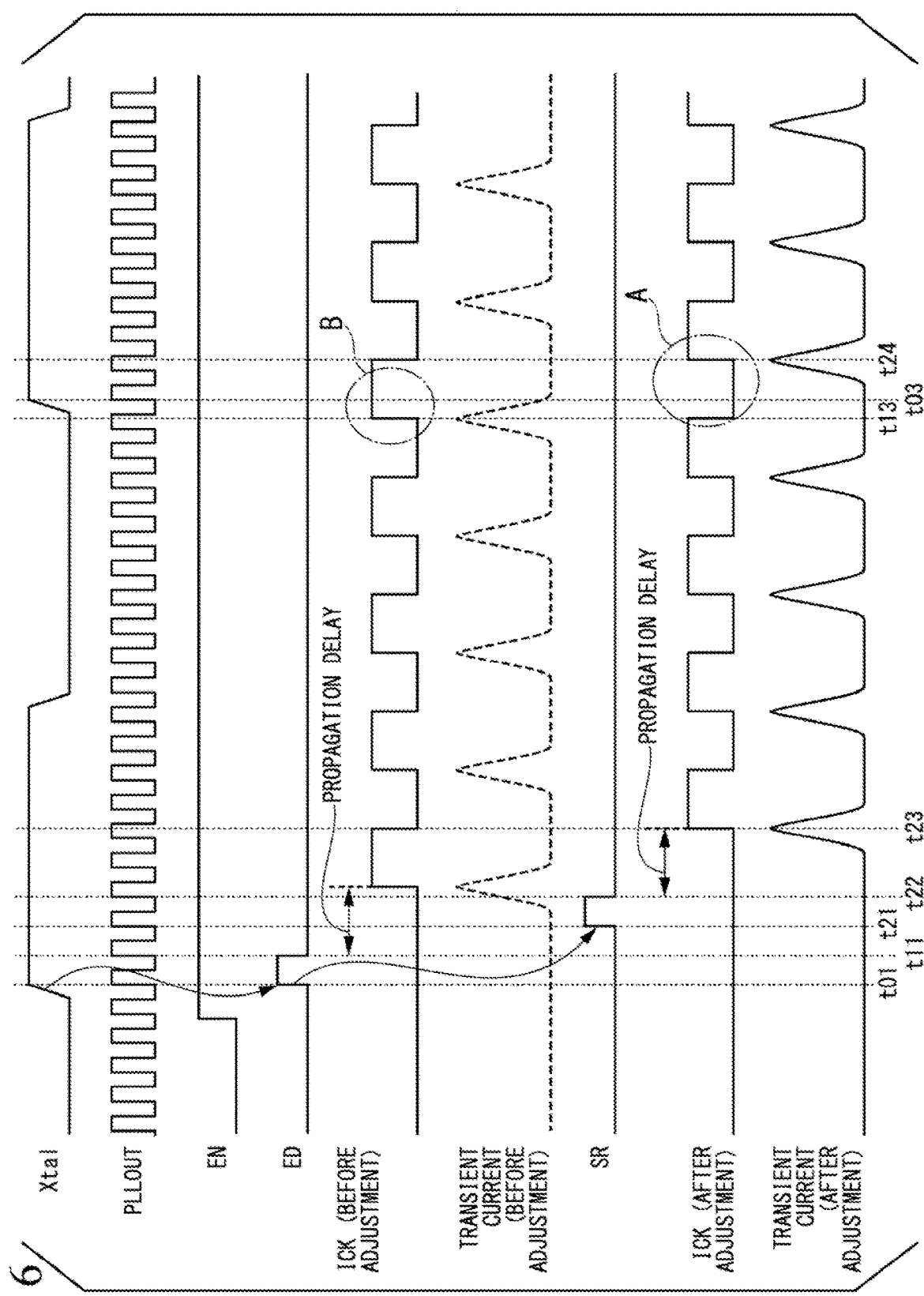
FIG. 6 is a timing chart illustrating a phase adjustment operation in the semiconductor integrated circuit according to the second embodiment of the invention.

An operation of adjusting a phase of an internal clock signal ICK with which the circuit elements in the large-scale circuit block 32 provided in the semiconductor integrated circuit 2 operate will be described below. FIG. 6 is a timing chart illustrating the phase adjustment operation in the semiconductor integrated circuit 2 according to the second embodiment of the invention. In FIG. 6, similarly to the phase adjustment operation in the semiconductor integrated circuit 1 according to the first embodiment illustrated in FIG. 3, timings of signals which are output from elements in a clock path of the internal clock signal ICK in the semiconductor integrated circuit 2 are illustrated. More specifically, the timings of an originally oscillated clock signal Xtal, a synchronization clock signal PLLOUT, a phase adjustment enable signal EN, an edge detection signal ED, a synchronization reset signal SR, and an internal clock signal ICK are illustrated. Similarly to the timing of the originally oscillated clock signal Xtal in the semiconductor integrated circuit 1 according to the first embodiment, the timing of the originally oscillated clock signal Xtal illustrated in FIG. 6 is also a timing of the reference clock signal RCK at which the edge detection circuit 310 detects a rising edge. In the following description, similarly to the phase adjustment operation in the semiconductor integrated circuit 1 according to the first embodiment, it is assumed that the edge detection circuit 310 detects a rising edge of the originally oscillated clock signal Xtal. In FIG. 6, similarly to the phase adjustment operation in the semiconductor integrated circuit 1 according to the first embodiment illustrated in FIG. 3, a timing of a transient current is illustrated as a timing of power supply noise (self-noise) which is generated at a timing based on the internal clock signal ICK in the semiconductor integrated circuit 2.

The semiconductor integrated circuit 2 is configured such that the phase of the internal clock signal ICK is adjusted in consideration of a delay of the internal clock signal ICK generated by the clock division circuit 31 due to the propagation delay 34. Accordingly, in FIG. 6, both an internal clock signal ICK (before adjustment) when the delay adjuster 320 does not adjust the timing of the synchronization reset signal SR and an internal clock signal ICK (after adjustment) when the delay adjuster 320 adjusts the timing of the synchronization reset signal SR are illustrated as the timings of the internal clock signal ICK. The timing of the internal clock signal ICK (after adjustment) illustrated in FIG. 6 is an example in which the delay adjuster 320 delays the edge detection signal ED by two periods of the synchronization clock signal PLLOUT and outputs the delayed signal as the synchronization reset signal SR to the clock division circuit 31. That is, in FIG. 6, the timing of the internal clock signal ICK (before adjustment) when the phase of the internal clock signal ICK generated by the clock division circuit 31 is displaced by one period of the synchronization clock signal PLLOUT similarly to the semiconductor integrated circuit 1 according to the first embodiment and the timing of the internal clock signal ICK (after adjustment) when the phase of the internal clock signal ICK is displaced by three periods of the synchronization clock signal PLLOUT are illustrated. The internal clock signal ICK illustrated in FIG. 6 is an example in which the synchronization clock signal PLLOUT is divided into five in frequency similarly to the phase adjustment operation in the semiconductor integrated circuit 1 according to the first embodiment illustrated in FIG. 3. That is, the frequency of the internal clock signal ICK illustrated in FIG. 6 is ⅕ times the frequency of the synchronization clock signal PLLOUT similarly to the phase adjustment operation in the semiconductor integrated circuit 1 according to the first embodiment illustrated in FIG. 3.

In the semiconductor integrated circuit 2, similarly to the semiconductor integrated circuit 1 according to the first embodiment, the phase adjustment operation is started when the system board of the device is powered on and the controller 20 is started. At this time, first, the controller 20 sets the phase adjustment enable signal EN to a "high" level similarly to the semiconductor integrated circuit 1 according to the first embodiment. Accordingly, the edge detection circuit 310 detects a rising edge of an originally oscillated clock signal Xtal based on the "high" level of the phase adjustment enable signal EN. In FIG. 6, similarly to the phase adjustment operation in the semiconductor integrated circuit 1 according to the first embodiment illustrated in FIG. 3, an operation when the edge detection circuit 310 has detected the rising edge of the originally oscillated clock signal Xtal at time t01 is illustrated.

When the rising edge of the originally oscillated clock signal Xtal is detected at time t01, the edge detection circuit 310 outputs the edge detection signal ED corresponding to one period of the synchronization clock signal PLLOUT to the delay adjuster 320. That is, the edge detection circuit 310 sets the edge detection signal ED to the "high" level at time t01 and then switches the edge detection signal ED to a "low" level at time tn.

Here, it is considered that the delay adjuster 320 outputs the edge detection signal ED output from the edge detection circuit 310 as the synchronization reset signal SR to the clock division circuit 31 without delaying the edge detection signal ED. In this case, the internal clock signal ICK generated by the clock division circuit 31 is delayed due to the propagation delay 34 and is output to the circuit elements in the large-scale circuit block 32 at the timing of the internal clock signal ICK (before adjustment). The timing of the rising edge of the internal clock signal ICK (before adjust-ment) is close to the timing of the rising edge of the originally oscillated clock signal Xtal as illustrated in a transition period of time B of the internal clock signal ICK. Accordingly, there is concern about power supply noise (self-noise) due to change (transition) in level of the output signal OUT of the semiconductor integrated circuit 2 serving as a cause of generation of jitter of the rising edge of the originally oscillated clock signal Xtal which is oscillated from the clock supply circuit (the crystal oscillator) or the reference clock signal RCK which is output from the comparator 10.

More specifically, at the timings of the internal clock signal ICK (before adjustment) illustrated in FIG. 6, the timing of the rising edge of the internal clock signal ICK at time t13 is close to the timing of the rising edge of the originally oscillated clock signal Xtal at time t03. Accordingly, there is concern about power supply noise (self-noise) due to a large transient current (before adjustment) which is indicated by a dotted line in FIG. 6 and which flows in synchronization with the rising edges of the internal clock signal ICK (before adjustment) serving as a cause of generation of jitter of the rising edge of the originally oscillated clock signal Xtal (the reference clock signal RCK) at time t03.

Accordingly, in the semiconductor integrated circuit 2, the delay adjuster 320 delays the edge detection signal ED output from the edge detection circuit 310 in the units of the period of the synchronization clock signal PLLOUT and outputs the delayed signal as the synchronization reset signal SR to the clock division circuit 31. In FIG. 6, the delay adjuster 320 delays the edge detection signal ED by two periods of the synchronization clock signal PLLOUT and outputs the delayed signal as the synchronization reset signal SR to the clock division circuit 31. Accordingly, the delay adjuster 320 sets the synchronization reset signal SR to the "high" level at time t21 and then switches the synchronization reset signal SR to the "low" level at time t22. As a result, the division operation of the clock division circuit 31 is reset by the "high" level of the synchronization reset signal SR output from the delay adjuster 320 and the clock division circuit 31 starts outputting the internal clock signal ICK into which the synchronization clock signal PLLOUT is divided in frequency at time t22 at which the synchronization reset signal SR has been switched to the "low" level, that is, reset has been released. The internal clock signal ICK which has been output from the clock division circuit 31 since time t22 is delayed due to the propagation delay 34. Accordingly, the internal clock signal ICK which has been output from the clock division circuit 31 since time t22 is output to the circuit elements of the large-scale circuit block 32 at the timings of the internal clock signal ICK (after adjustment) since time t23 which is delayed due to the propagation delay 34. The timing of the rising edge of the internal clock signal ICK (after adjustment) grows apart from the timing of the rising edge of the originally oscillated clock signal Xtal as illustrated in the transition period of time A of the internal clock signal ICK. That is, the internal clock signal ICK (after adjustment) output from the clock division circuit 31 is a clock signal of which the phase is more suitably displaced from the timing of the rising edge of the originally oscillated clock signal Xtal detected by the edge detection circuit 310. Accordingly, power supply noise (self-noise) due to change (transition) in level of the output signal OUT of the semiconductor integrated circuit 2 does not serve as a cause of generation of jitter of the rising edge of the originally oscillated clock signal Xtal oscillated from the clock supply circuit (the crystal oscillator) or the reference clock signal RCK output from the comparator 10.

More specifically, in the timings of the internal clock signal ICK (after adjustment) illustrated in FIG. 6, the timing of the rising edge of the internal clock signal ICK at time t24 grows apart from the timing of the rising edge of the originally oscillated clock signal Xtal at time t03. Accordingly, power supply noise (self-noise) due to a large transient current (after adjustment) which is indicated by a solid line in FIG. 6 and which flows in synchronization with the rising edges of the internal clock signal ICK (after adjustment) does not serve as a cause of generation of jitter of the rising edges of the originally oscillated clock signal Xtal (the reference clock signal RCK) at time t03.

In this way, in the semiconductor integrated circuit 2, the delay adjuster 320 delays the timing at which the clock division circuit 31 is reset after the edge detection circuit 310 has detected the rising edge of the reference clock signal RCK. Accordingly, in the semiconductor integrated circuit 2, even when there is a propagation delay in the clock path of the internal clock signal ICK, the timing of the rising edge of the internal clock signal ICK is displaced from the timing of the rising edge of the reference clock signal RCK (the originally oscillated clock signal Xtal). As a result, in the semiconductor integrated circuit 2, similarly to the semiconductor integrated circuit 1 according to the first embodiment, the timing of power supply noise (self-noise) which is generated in the system board of the device due to change (transition) in level of the output signal OUT which is output to the outside is displaced from the timing of the rising edge of the reference clock signal RCK (the originally oscillated clock signal Xtal). Accordingly, in the semiconductor integrated circuit 2, similarly to the semiconductor integrated circuit 1 according to the first embodiment, even when power supply noise (self-noise) is generated, the power supply noise does not serve as a cause of fluctuation (generation of jitter) of the rising edge of the reference clock signal RCK (the originally oscillated clock signal Xtal). In other words, in the semiconductor integrated circuit 2, similarly to the semiconductor integrated circuit 1 according to the first embodiment, power supply noise (self-noise) serving as a cause of generation of fluctuation (jitter) of the rising edge of the reference clock signal RCK (the originally oscillated clock signal Xtal) is removed.

According to the second embodiment, the semiconductor integrated circuit (the semiconductor integrated circuit 2) is configured to further include a delay adjuster (the delay adjuster 320) configured to delay an edge detection signal (the edge detection signal ED) in the units of periods of a synchronization clock signal (the synchronization clock signal PLLOUT).

According to the second embodiment, the semiconductor integrated circuit 2 is configured to further include a controller (the controller 20) configured to cause an edge detection circuit (the edge detection circuit 310) to start detection of an edge (a rising edge in the first embodiment) and to set a time by which the edge detection signal (the edge detection signal ED) is delayed in the delay adjuster 320.

As described above, in the semiconductor integrated circuit 2 according to the second embodiment, similarly to the semiconductor integrated circuit 1 according to the first embodiment, the edge detection circuit 310 detects a rising edge of a reference clock signal RCK. In the semiconductor integrated circuit 2 according to the second embodiment, the delay adjuster 320 resets the clock division circuit 31 at a delayed timing. Accordingly, in the semiconductor integrated circuit 2 according to the second embodiment, even when there is a propagation delay in a clock path of an internal clock signal ICK, the timing of the rising edge of the internal clock signal ICK which is generated by the clock division circuit 31 is displaced from the timing of the rising edge of the reference clock signal RCK (an originally oscillated clock signal Xtal) similarly to the semiconductor integrated circuit 1 according to the first embodiment. Accordingly, in the semiconductor integrated circuit 2 according to the second embodiment, similarly to the semiconductor integrated circuit 1 according to the first embodiment, even when power supply noise (self-noise) is generated in the system board of the device (system) in which the semiconductor integrated circuit 2 according to the second embodiment is mounted due to change (transition) in level of an output signal OUT which is output to the outside, a timing at which the power supply noise (self-noise) is generated is displaced from the timing of the rising edge of the reference clock signal RCK (the originally oscillated clock signal Xtal). Accordingly, in the semiconductor integrated circuit 2 according to the second embodiment, similarly to the semiconductor integrated circuit 1 according to the first embodiment, the generated power supply noise (self-noise) does not serve as a cause of fluctuation (generation of jitter) of the rising edge of the reference clock signal RCK (the originally oscillated clock signal Xtal). That is, in the semiconductor integrated circuit 2 according to the second embodiment, similarly to the semiconductor integrated circuit 1 according to the first embodiment, generation of power supply noise (self-noise) at a timing at which at which fluctuation (jitter) is generated in the rising edge of the reference clock signal RCK (the originally oscillated clock signal Xtal) is prevented.

Accordingly, in the device (system) in which the semiconductor integrated circuit 2 according to the second embodiment is mounted, similarly to the device (system) in which the semiconductor integrated circuit 1 according to the first embodiment is mounted, it is possible to curb deterioration in performance of the system as a whole due to power supply noise (self-noise) which is generated in the semiconductor integrated circuit 2 according to the second embodiment.

In the semiconductor integrated circuit 2 according to the second embodiment, a configuration in which the delay adjuster 320 displaces the phase of the internal clock signal ICK generated by the clock division circuit 31 from the timing of the rising edge of the reference clock signal RCK (the originally oscillated clock signal Xtal) in the units of periods of the synchronization clock signal PLLOUT based on the synchronization reset signal SR obtained by delaying the edge detection signal ED by a fixed delay time corresponding to the time (TICK-TDICK) has been described above. In the semiconductor integrated circuit 2 according to the second embodiment, a configuration in which the delay adjuster 320 can change the period of the synchronization clock signal PLLOUT by which the edge detection signal ED is delayed under the control of the controller 20 has also been described above. However, in the semiconductor integrated circuit 2 according to the second embodiment, a method of allowing the controller 20 to change the period of the synchronization clock signal PLLOUT by which the edge detection signal ED is delayed by the delay adjuster 320 has not been described above. For example, in the semiconductor integrated circuit 2 according to the second embodiment, the controller 20 may be configured to change the period of the synchronization clock signal PLLOUT by which the edge detection signal ED is delayed by the delay adjuster 320 based on a displacement amount between the timing of the rising edge of the reference clock signal RCK and the timing of the rising edge of the internal clock signal ICK, that is, a phase displacement amount between the reference clock signal RCK and the internal clock signal ICK.

Third Embodiment

A semiconductor integrated circuit according to a third embodiment of the invention will be described below. The semiconductor integrated circuit according to the third embodiment of the invention employs a configuration in which the phase of an internal clock signal ICK is adjusted at a timing in which a propagation delay in a clock path of the internal clock signal ICK is reflected based on a phase displacement amount between a reference clock signal RCK and the internal clock signal ICK.

Figure 7:
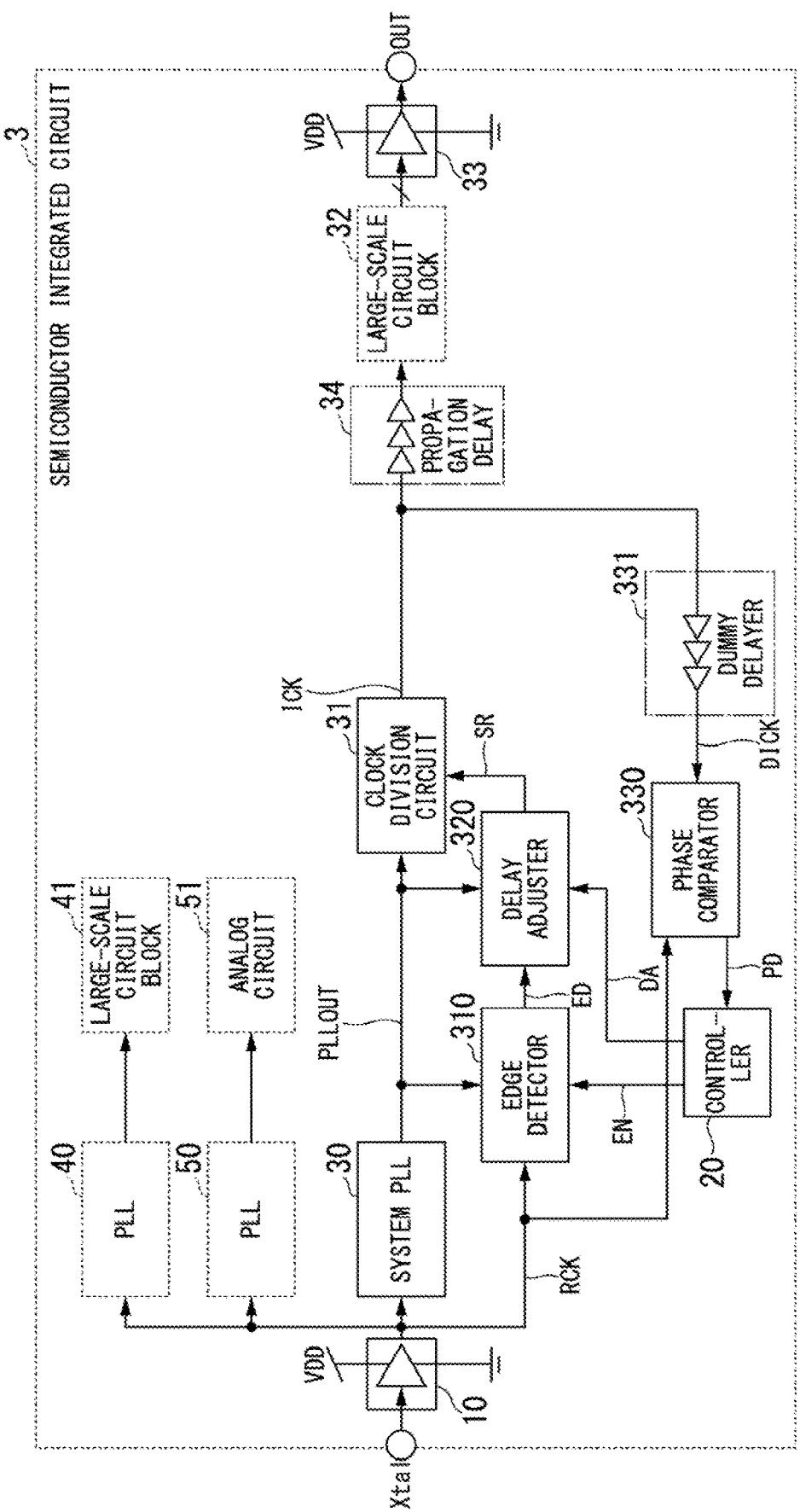
FIG. 7 is a block diagram schematically illustrating a configuration of a semiconductor integrated circuit according to a third embodiment of the invention.

FIG. 7 is a block diagram schematically illustrating the configuration of the semiconductor integrated circuit according to the third embodiment of the invention. The configuration of the semiconductor integrated circuit according to the third embodiment illustrated in FIG. 7 includes the same elements as in the semiconductor integrated circuit 1 according to the first embodiment illustrated in FIG. 2 or the semiconductor integrated circuit 2 according to the second embodiment illustrated in FIG. 4. Accordingly, out of the elements of the semiconductor integrated circuit according to the third embodiment, the same elements as the elements of the semiconductor integrated circuit 1 according to the first embodiment or the semiconductor integrated circuit 2 according to the second embodiment will be referred to by the same reference signs and detailed description thereof will be omitted.

The semiconductor integrated circuit 3 illustrated in FIG. 7 includes a comparator 10, a controller 20, a system PLL 30, a clock division circuit 31, an edge detection circuit 310, a delay adjuster 320, a phase comparator 330, a dummy delayer 331, a large-scale circuit block 32, and an output buffer 33. In the semiconductor integrated circuit 3, the phase comparator 330 and the dummy delayer 331 are added to the semiconductor integrated circuit 2 according to the second embodiment. In the configuration of the semiconductor integrated circuit 3 illustrated in FIG. 7, similarly to the semiconductor integrated circuit 2 according to the second embodiment illustrated in FIG. 4, a propagation delay in a clock path of an internal clock signal ICK is schematically illustrated as a propagation delay 34. The semiconductor integrated circuit 3 further includes a PLL 40, a large-scale circuit block 41, a PLL 50, and an analog circuit 51.

Similarly to the semiconductor integrated circuit 1 according to the first embodiment illustrated in FIG. 2 or the semiconductor integrated circuit 2 according to the second embodiment illustrated in FIG. 4, the semiconductor integrated circuit 3 is a large-scale semiconductor integrated circuit which is realized, for example, by an ASIC. Similarly to the semiconductor integrated circuit 1 according to the first embodiment or the semiconductor integrated circuit 2 according to the second embodiment, the semiconductor integrated circuit 3 realizes a predetermined function in a device (system) in which the semiconductor integrated circuit 3 is mounted. Similarly to the semiconductor integrated circuit 1 according to the first embodiment or the semiconductor integrated circuit 2 according to the second embodiment, the semiconductor integrated circuit 3 is mounted on a system board constituting a system of the device and performs an operation for realizing the predetermined function in the system of the device based on a clock signal of a predetermined frequency which is output from a clock supply circuit mounted on the same system board. In the following description, similarly to the semiconductor integrated circuit 1 according to the first embodiment or the semiconductor integrated circuit 2 according to the second embodiment, it is assumed that the clock supply circuit mounted on the system board of the device is a crystal oscillator and the semiconductor integrated circuit 3 operates based on an originally oscillated clock signal Xtal which is oscillated from the crystal oscillator.

In the semiconductor integrated circuit 3, the comparator 10 supplies the originally oscillated clock signal Xtal of which the waveform has been shaped to the phase comparator 330 in addition to the system PLL 30, the edge detection circuit 310, the PLL 40, and the PLL 50.

In the semiconductor integrated circuit 3, the clock division circuit 31 outputs the generated internal clock signal ICK to the dummy delayer 331 in addition to the circuit elements in the large-scale circuit block 32.

In the semiconductor integrated circuit 3, the controller 20 determines a phase adjustment amount of an internal clock signal ICK and sets the determined phase adjustment amount in the delay adjuster 320. More specifically, the controller 20 determines a time by which an edge detection signal ED is delayed in the delay adjuster 320, that is, the number of stages of D-type flip-flops, and outputs a delay adjustment signal DA for setting (selecting) the determined number of stages of D-type flip-flops to the delay adjuster 320. The configuration of the delay adjuster 320 provided in the semiconductor integrated circuit 3 is the same as the configuration of the delay adjuster 320 illustrated in FIG. 5. Accordingly, in the delay adjuster 320, the selector 3205 selects the edge detection signal ED or one signal out of the output signals of four D-type flip-flops based on the delay adjustment signal DA output from the controller 20 and outputs the selected signal as a synchronization reset signal SR.

The dummy delayer 331 is a circuit that simulates a delay amount corresponding to a propagation delay in a clock path of the internal clock signal ICK. More specifically, the dummy delayer 331 is a delay circuit that simulates a propagation delay based on arrangement of circuit elements provided in the large-scale circuit block 32 when a signal line of the internal clock signal ICK output from the clock division circuit 31 is wired in the circuit elements. That is, the dummy delayer 331 simulates the same delay amount as the propagation delay 34. In the configuration of the semiconductor integrated circuit 3 illustrated in FIG. 7, the dummy delayer 331 having a configuration for simulating the same delay amount as the propagation delay 34 using a configuration in which a plurality of buffer circuits are connected in series is illustrated. The configuration for allowing the dummy delayer 331 to simulate the same delay amount as the propagation delay 34 is not limited to the configuration of the dummy delayer 331 illustrated in FIG. 7, and may be any configuration as long as it can simulate the same delay amount as the propagation delay 34. The dummy delayer 331 delays the internal clock signal ICK output from the clock division circuit 31 by the same delay time as the propagation delay 34 and outputs the delayed signal to the phase comparator 330.

The phase comparator 330 compares the phase of the internal clock signal ICK delayed by the dummy delayer 331 with the phase of the reference clock signal RCK output from the comparator 10. The phase comparator 330 compares the phases of the clock signals using the reference clock signal RCK as a clock signal serving as a reference and using the internal clock signal ICK delayed by the dummy delayer 331 (hereinafter referred to as a "delayed internal clock signal DICK") as a clock signal serving as a comparison object. The phase comparator 330 outputs a phase comparison result signal PD indicating a result of phase comparison between the reference clock signal RCK and the delayed internal clock signal DICK to the controller 20. The phase comparison result signal PD which is output from the phase comparator 330 includes information indicating whether the phase of the rising edge of the delayed internal clock signal DICK is advanced or delayed with respect to the phase of the rising edge of the reference clock signal RCK.

In the semiconductor integrated circuit 3, the controller 20 determines a time by which the delay adjuster 320 delays the edge detection signal ED based on the phase comparison result signal PD output from the phase comparator 330 and sets a phase adjustment amount of the internal clock signal ICK in the delay adjuster 320 based on the result of determination. More specifically, in the semiconductor integrated circuit 3, the controller 20 determines the number of stages of the edge detection signal ED which is delayed by the D-type flip-flops provided in the delay adjuster 320, and outputs information indicating the determined number of stages as a delay adjustment signal DA to the selector 3205 provided in the delay adjuster 320. In the semiconductor integrated circuit 3, the selector 3205 provided in the delay adjuster 320 selects an output signal output from the D-type flip-flop corresponding to the number of stages indicated by the delay adjustment signal DA and outputs the selected signal as a synchronization reset signal SR to the clock division circuit 31. Accordingly, in the semiconductor integrated circuit 3, the phase of the internal clock signal ICK generated by the clock division circuit 31 is changed, that is, the phase adjustment amount of the internal clock signal ICK is changed, based on the phase difference between the reference clock signal RCK and the delayed internal clock signal DICK which are compared by the phase comparator 330.

In the semiconductor integrated circuit 3, the internal clock signal ICK generated by the clock division circuit 31 is a clock signal which is synchronized with the timing of the first rising edge of the reference clock signal RCK detected by the edge detection circuit 310 after the controller 20 has output the phase adjustment enable signal EN to the edge detection circuit 310. In the semiconductor integrated circuit 3, similarly to the semiconductor integrated circuit 2 according to the second embodiment, since the delay adjuster 320 delays the timing of the synchronization reset signal SR, the internal clock signal ICK generated by the clock division circuit 31 is a clock signal of which the phase is displaced by a plurality of periods of the synchronization clock signal PLLOUT.

Accordingly, in the semiconductor integrated circuit 3, similarly to the semiconductor integrated circuit 2 according to the second embodiment, the output signal OUT output from the output buffer 33 changes (transitions) in level at a timing which is delayed by a plurality of periods of the synchronization clock signal PLLOUT delayed by the delay adjuster 320. In the semiconductor integrated circuit 3, similarly to the semiconductor integrated circuit 1 according to the first embodiment or the semiconductor integrated circuit 2 according to the second embodiment, power supply noise (self-noise) due to change (transition) in level of the output signal OUT does not serve as a cause of generation of jitter of the rising edge of the originally oscillated clock signal Xtal oscillated from the clock supply circuit (the crystal oscillator) or the reference clock signal RCK output from the comparator 10. On the other hand, in the semiconductor integrated circuit 3, since the level of the output signal OUT changes (transitions) at a timing based on the phase difference between the reference clock signal RCK and the delayed internal clock signal DICK, it is possible to more suitably curb jitter which may be generated in the rising edge of the originally oscillated clock signal Xtal or the reference clock signal RCK.

In the semiconductor integrated circuit 3, the phase adjustment amount of the internal clock signal ICK is different from that in the semiconductor integrated circuit 2 according to the second embodiment, but the phase adjustment operation of the internal clock signal ICK in the semiconductor integrated circuit 3 is the same as that in the semiconductor integrated circuit 2 according to the second embodiment. Accordingly, details of the phase adjustment operation of the internal clock signal ICK in the semiconductor integrated circuit 3 will be omitted.

Figure 8:
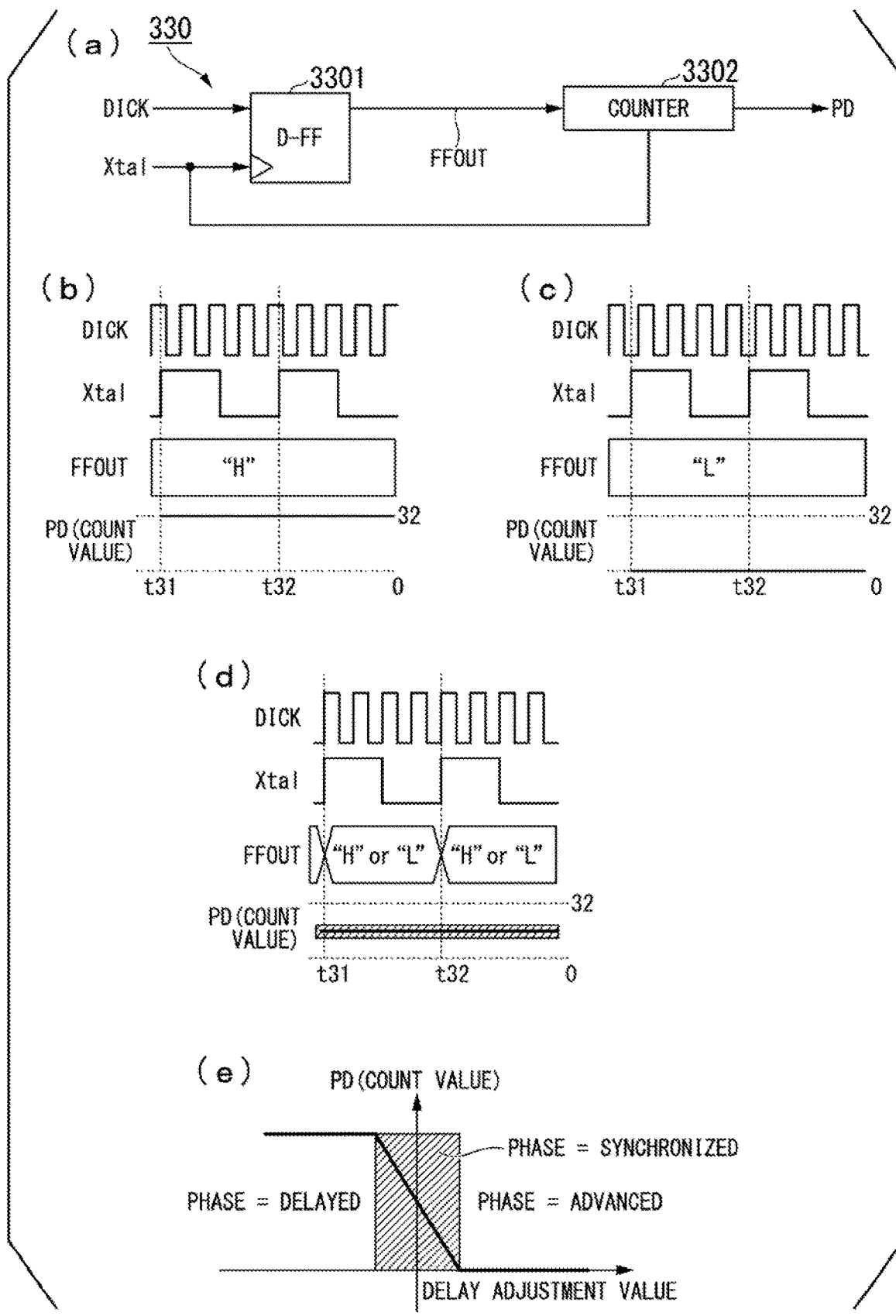
FIG. 8 is a block diagram schematically illustrating an example of a configuration of a phase comparator which is provided in the semiconductor integrated circuit according to the third embodiment of the invention and an example of an operation of the phase comparator.

An example of the configuration and the phase comparison operation of the phase comparator 330 will be described below. FIG. 8 is a diagram illustrating an example of a schematic configuration of the phase comparator 330 provided in the semiconductor integrated circuit 3 according to the third embodiment of the invention and an example of the operation of the phase comparator 330. An example of the configuration of the phase comparator 330 is illustrated in (a) of FIG. 8. An example of the phase comparison operation in the phase comparator 330 having the configuration illustrated in (a) of FIG. 8 is illustrated in (b) to (d) of FIG. 8. An example of a range of a time (a delay adjustment value) which is determined by the controller 20 based on the phase comparison result signal PD output from the phase comparator 330 and by which the delay adjuster 320 delays the edge detection signal ED is schematically illustrated in (e) of FIG. 8.

First, the configuration of the phase comparator 330 illustrated in (a) of FIG. 8 will be described below. In the semiconductor integrated circuit 3, similarly to the semiconductor integrated circuit 1 according to the first embodiment or the semiconductor integrated circuit 2 according to the second embodiment, the reference clock signal RCK is the same clock signal as the originally oscillated clock signal Xtal. In the following description, it is assumed that the phase comparator 330 compares the phases of the delayed internal clock signal DICK and the originally oscillated clock signal Xtal.

In the phase comparator 330, the originally oscillated clock signal Xtal is used as a clock signal serving as a reference for phase comparison and the delayed internal clock signal DICK is used as a clock signal serving as an object for phase comparison. The phase comparator 330 includes a D-type flip-flop (D-FF) 3301 and a counter 3302. In the phase comparator 330, the delayed internal clock signal DICK is input as a data input of the D-FF 3301 and the originally oscillated clock signal Xtal is input as a clock input of the D-FF 3301. In the phase comparator 330, an output signal FFOUT output from the D-FF 3301 is input to the counter 3302. In the phase comparator 330, the originally oscillated clock signal Xtal is input as a clock input of the counter 3302. In the phase comparator 330, an output signal of the counter 3302 is output as a phase comparison result signal PD.

In the phase comparator 330, the D-FF 3301 receives and holds the level of the delayed internal clock signal DICK at the timing of the rising edge of the originally oscillated clock signal Xtal. In the phase comparator 330, the counter 3302 counts the level of the output signal FFOUT output from the D-FF 3301, that is, the held delayed internal clock signal DICK, at the timing of the rising edge of the originally oscillated clock signal Xtal. The counter 3302 counts the time at which the output signal FFOUT output from the D-FF 3301 is at a "high" level by a predetermined number of times, that is, by a period of time of a predetermined period in the originally oscillated clock signal Xtal. In the phase comparator 330, the counter 3302 outputs a value of the result of counting by the predetermined number of times (a count value) as the phase comparison result signal PD. That is, the phase comparator 330 outputs the number of times at which the delayed internal clock signal DICK is at the "high" level and which is counted at the timing of the rising edge of the originally oscillated clock signal Xtal by the counter 3302 as information (the phase comparison result signal PD) indicating whether the phase of the rising edge of the delayed internal clock signal DICK is advanced or delayed with respect to the phase of the rising edge of the originally oscillated clock signal Xtal.

An example of the phase comparison operation in the phase comparator 330 illustrated in (a) of FIG. 8 will be described below with reference to (b) to (d) of FIG. 8. As long as the period of the originally oscillated clock signal Xtal in which the counter 3302 provided in the phase comparator 330 counts the "high" level of the output signal FFOUT output from the D-FF 3301 is a period which can be counted a plurality of times, the length thereof, that is, the number of times which are counted, is not particularly limited. In the following description, for example, it is assumed that the counter 3302 provided in the phase comparator 330 counts the "high" level of the output signal FFOUT output from the D-FF 3301 by a period of time corresponding to 32 periods of the originally oscillated clock signal Xtal.

First, the operation when the phase of the rising edge of the delayed internal clock signal DICK is normally delayed with respect to the phase of the rising edge of the originally oscillated clock signal Xtal will be described below. That is, a case in which the phase of the rising edge of the delayed internal clock signal DICK is delayed with respect to the phase of the rising edge of the originally oscillated clock signal Xtal and is stabilized in this state will be described. In this case, as illustrated in (b) of FIG. 8, the D-FF 3301 receives and holds the "high" level of the delayed internal clock signal DICK at time t31 or time t32, which is a timing of the rising edge of the originally oscillated clock signal Xtal. The D-FF 3301 outputs the output signal FFOUT of the held "high" level to the counter 3302. Accordingly, the counter 3302 counts the "high" level of the output signal FFOUT output from the D-FF 3301 at the timing of the rising edge of the originally oscillated clock signal Xtal 32 times and outputs the phase comparison result signal PD of count value=32.

Subsequently, the operation when the phase of the rising edge of the delayed internal clock signal DICK is normally advanced with respect to the phase of the rising edge of the originally oscillated clock signal Xtal will be described below. That is, a case in which the phase of the rising edge of the delayed internal clock signal DICK is advanced with respect to the phase of the rising edge of the originally oscillated clock signal Xtal and is stabilized in this state will be described. In this case, as illustrated in (c) of FIG. 8, the D-FF 3301 receives and holds the "low" level of the delayed internal clock signal DICK at time t31 or time t32, which is a timing of the rising edge of the originally oscillated clock signal Xtal. The D-FF 3301 outputs the output signal FFOUT of the held "low" level to the counter 3302. Accordingly, the counter 3302 does not count the "high" level of the output signal FFOUT output from the D-FF 3301 at the timing of the rising edge of the originally oscillated clock signal Xtal 32 times and outputs the phase comparison result signal PD of count value=0.

Subsequently, the operation when the phase of the rising edge of the delayed internal clock signal DICK is delayed and advanced with respect to the phase of the rising edge of the originally oscillated clock signal Xtal will be described below. That is, a case in which the phase of the rising edge of the delayed internal clock signal DICK is synchronized with respect to the phase of the rising edge of the originally oscillated clock signal Xtal and thus is not stabilized in any one state will be described. In this case, as illustrated in (d) of FIG. 8, the D-FF 3301 receives and holds the "high" level or the "low" level of the delayed internal clock signal DICK at time t31 or time t32, which is a timing of the rising edge of the originally oscillated clock signal Xtal. The D-FF 3301 outputs the output signal FFOUT of the held "high" or "low" level to the counter 3302. Accordingly, the counter 3302 counts only the "high" level of the output signal FFOUT output from the D-FF 3301 at the timing of the rising edge of the originally oscillated clock signal Xtal and outputs the phase comparison result signal PD with the count value in a range of 31 to 1. An example in which the counter 3302 outputs the phase comparison result signal PD of count value≈15 (a plurality of values in a range close to count value=15) is illustrated in (d) of FIG. 8.

With the aforementioned configuration and operation, the phase comparator 330 outputs the phase comparison result signal PD indicating the result of comparison in phase between the delayed internal clock signal DICK and the originally oscillated clock signal Xtal to the controller 20. That is, the phase comparator 330 outputs the phase comparison result signal PD with count values which are different depending on the phase state of the rising edge of the originally oscillated clock signal Xtal with respect to the phase of the rising edge of the delayed internal clock signal DICK to the controller 20. Accordingly, in the semiconductor integrated circuit 3, the controller 20 determines a time by which the delay adjuster 320 delays the edge detection signal ED as the phase adjustment amount of the internal clock signal ICK based on the count value indicated by the phase comparison result signal PD output from the phase comparator 330.

In (a) to (d) of FIG. 8, the phase comparator 330 with the configuration and operation of counting the number of times the delayed internal clock signal DICK is at the "high" level in the period of time of predetermined periods of the originally oscillated clock signal Xtal is illustrated. However, the phase comparator 330 is not limited to the phase comparator with the configuration and operation illustrated in (a) to (d) of FIG. 8. More specifically, the phase comparator 330 provided in the semiconductor integrated circuit 3 may have any configuration and operation as long as it can compare the phases of the delayed internal clock signal DICK and the originally oscillated clock signal Xtal and output the phase comparison result signal PD indicating at least whether the phase of the rising edge of the delayed internal clock signal DICK is synchronized with the phase of the rising edge of the reference clock signal RCK.

An example of the operation of allowing the controller 20 to determine the time by which the delay adjuster 320 delays the edge detection signal ED (the delay adjustment value) will be described below with reference to (e) of FIG. 8. The controller 20 determines the time by which the delay adjuster 320 delays the edge detection signal ED (the delay adjustment value) in a range in which the count value indicated by the phase comparison result signal PD output from the phase comparator 330 indicates that the phases of the delayed internal clock signal DICK and the originally oscillated clock signal Xtal are delayed or advanced relatively and are stabilized in that state. In other words, the controller 20 determines the number of stages of D-type flip-flops provided in the delay adjuster 320 in a range in which the count value indicated by the phase comparison result signal PD output from the phase comparator 330 indicates that the phase of the rising edge of the delayed internal clock signal DICK is not synchronized with the phase of the rising edge of the originally oscillated clock signal Xtal.

As described above, when the phase of the rising edge of the delayed internal clock signal DICK is delayed with respect to the phase of the rising edge of the originally oscillated clock signal Xtal, the phase comparator 330 outputs the phase comparison result signal PD of count value=32. When the phase of the rising edge of the delayed internal clock signal DICK is advanced with respect to the phase of the rising edge of the originally oscillated clock signal Xtal, the phase comparator 330 outputs the phase comparison result signal PD of count value=0. When the phase of the rising edge of the delayed internal clock signal DICK is synchronized with the phase of the rising edge of the originally oscillated clock signal Xtal, the phase comparator 330 outputs the phase comparison result signal PD of a count value in the range of 31 to 1.

Accordingly, the controller 20 determines the range in which the count value indicated by the phase comparison result signal PD output from the phase comparator 330 indicates that the phases of the delayed internal clock signal DICK and the originally oscillated clock signal Xtal are delayed or advanced relatively as the delay adjustment value. That is, the controller 20 determines the delay adjustment value in the range in which the count value indicated by the phase comparison result signal PD output from the phase comparator 330 is in the range with count value=32 or count value=0 (a range other than "phase=synchronized" in (e) of FIG. 8), and outputs the delay adjustment signal DA for setting (selecting) the number of stages of D-type flip-flops in which the delay adjustment value is obtained to the delay adjuster 320.

In the semiconductor integrated circuit 3, similarly to the semiconductor integrated circuit 1 according to the first embodiment or the semiconductor integrated circuit 2 according to the second embodiment, when the system board of the device is powered on and the controller 20 is started, the phase adjustment operation is started and the phase adjustment enable signal EN is set to the "high" level. However, in the semiconductor integrated circuit 3, the delay adjustment signal DA output to the delay adjuster 320 in the phase adjustment operation when the controller 20 is started is not limited to the delay adjustment value in the range in which the phases of the delayed internal clock signal DICK and the originally oscillated clock signal Xtal are delayed or advanced relatively. That is, it can also be considered that the phase of the rising edge of the delayed internal clock signal DICK is synchronized with the phase of the rising edge of the originally oscillated clock signal Xtal as the result of phase comparison in the phase comparator 330 after the delay adjuster 320 has operated by the number of stages of D-type flip-flops set therein when the controller 20 has been started. In this case, the controller 20 temporarily sets the phase adjustment enable signal EN to the "low" level, outputs the delay adjustment signal DA with a different delay adjustment value to the delay adjuster 320, and sets the phase adjustment enable signal EN to the "high" level again. That is, when the phase comparison result signal PD indicating that the phase of the rising edge of the delayed internal clock signal DICK is synchronized with the phase of the rising edge of the originally oscillated clock signal Xtal is output from the phase comparator 330, the controller 20 performs the phase adjustment operation again similarly to that when the controller has been started. Accordingly, the delay adjuster 320 outputs the synchronization reset signal SR for selecting the output signal output from the number of stages of D-type flip-flops which differs depending on the selector 3205 to the clock division circuit 31, and the clock division circuit 31 generates the internal clock signal ICK of another phase again and outputs the generated signal to the circuit elements in the large-scale circuit block 32.

When the phase comparison result signal PD indicating that the phase of the rising edge of the delayed internal clock signal DICK is synchronized with the phase of the rising edge of the originally oscillated clock signal Xtal is further output from the phase comparator 330, the controller 20 changes the phase of the internal clock signal ICK generated by the clock division circuit 31 by performing the phase adjustment operation again in the same way. That is, the controller 20 changes the phase adjustment amount of the internal clock signal ICK generated by the clock division circuit 31 by repeating the phase adjustment operation based on the phase comparison result signal PD output from the phase comparator 330.

The controller 20 may be configured to store the final delay adjustment value by which the phase adjustment amount of the internal clock signal ICK generated from the clock division circuit 31 is changed. In this case, in the device (system) in which the semiconductor integrated circuit 3 is mounted, for example, when power consumption is decreased without powering off the system board, that is, when a low power consumption mode such as a standby mode or a sleep mode in which operations of other elements are stopped in which the reference clock signal RCK continues to be generated is returned to a normal operation mode, the phase adjustment amount of the internal clock signal ICK generated from the clock division circuit 31 can be changed based on the stored delay adjustment value. Accordingly, in the device (system) in which the semiconductor integrated circuit 3 is mounted, the operation mode can be returned to the normal operation mode prior to repetition of the phase adjustment operation of the controller 20 based on the phase comparison result signal PD output from the phase comparator 330. That is, in the device (system) in which the semiconductor integrated circuit 3 is mounted, when the relationship in phase between the originally oscillated clock signal Xtal and the internal clock signal ICK is not changed, the previous delay adjustment value can be used without performing the phase adjustment operation for changing the phase adjustment amount of the internal clock signal ICK generated by the clock division circuit 31.

In (e) of FIG. 8, the operation of determining the delay adjustment value only in a range other than the range of "phase-synchronized," that is, only when the count value indicated by the phase comparison result signal PD is count value=32 or count value=0, with the range other than the range in which the count value indicated by the phase comparison result signal PD output from the phase comparator 330 indicates count value=32 or count value=0 being defined as the range of "phase=synchronized" is illustrated. However, for example, it is conceivable that there is an allowable range in fluctuation (jitter) of the rising edge of the originally oscillated clock signal Xtal output from the clock supply circuit (the crystal oscillator) or the reference clock signal RCK oscillated from the comparator 10 due to power supply noise (self-noise) which is generated in the semiconductor integrated circuit 3. In this case, the controller 20 may extend the range of "phase=delayed" or "phase=advanced" and set the case in which the count value indicated by the phase comparison result signal PD is, for example, between count value=3 and count value=30 as the range of "phase=synchronized."

In this way, in the semiconductor integrated circuit 3, a delay of the internal clock signal ICK which is input to the circuit elements provided in the large-scale circuit block 32 due to the propagation delay (the propagation delay 34) in the clock path of the internal clock signal ICK is simulated using the dummy delayer 331. In the semiconductor integrated circuit 3, the phase comparator 330 compares the phase of the rising edge of the internal clock signal ICK delayed by the dummy delayer 331 (the delayed internal clock signal DICK) with the phase of the rising edge of the reference clock signal RCK (the originally oscillated clock signal Xtal). In the semiconductor integrated circuit 3, the controller 20 sets the time by which the delay adjuster 320 delays the edge detection signal ED, that is, the phase adjustment amount of the internal clock signal ICK generated by the clock division circuit 31, in the delay adjuster 320 based on the phase comparison result signal PD output from the phase comparator 330. Accordingly, in the semiconductor integrated circuit 3, even when there is a propagation delay in a clock path of an internal clock signal ICK, the timing of the rising edge of the internal clock signal ICK is displaced from the timing of the rising edge of the reference clock signal RCK (the originally oscillated clock signal Xtal). Accordingly, in the semiconductor integrated circuit 3, similarly to the semiconductor integrated circuit 1 according to the first embodiment or the semiconductor integrated circuit 2 according to the second embodiment, the timing of power supply noise (self-noise) which is generated in the system board of the device due to change (transition) in level of the output signal OUT which is output to the outside is displaced from the timing of the rising edge of the reference clock signal RCK (the originally oscillated clock signal Xtal). Accordingly, in the semiconductor integrated circuit 3, similarly to the semiconductor integrated circuit 1 according to the first embodiment or the semiconductor integrated circuit 2 according to the second embodiment, even when power supply noise (self-noise) is generated, the power supply noise does not serve as a cause of fluctuation (generation of jitter) of the rising edge of the reference clock signal RCK (the originally oscillated clock signal Xtal). In other words, in the semiconductor integrated circuit 3, similarly to the semiconductor integrated circuit 1 according to the first embodiment or the semiconductor integrated circuit 2 according to the second embodiment, power supply noise (self-noise) serving as a cause of generation of fluctuation (jitter) of the rising edge of the reference clock signal RCK (the originally oscillated clock signal Xtal) is removed.

According to the third embodiment, the semiconductor integrated circuit (the semiconductor integrated circuit 3) is configured to further include a delayer (the dummy delayer 331) that simulates a propagation delay (the propagation delay 34) in a path of a divided clock signal (the internal clock signal ICK) and delays the internal clock signal ICK by a time based on the propagation delay and a phase comparator (the phase comparator 330) that compares the phases of the reference clock signal (which may be the reference clock signal RCK or the originally oscillated clock signal Xtal) and the internal clock signal ICK which is delayed by the dummy delayer 331.

According to the third embodiment, the semiconductor integrated circuit 3 is configured such that the delay adjuster (the delay adjuster 320) delays the edge detection signal (the edge detection signal ED) by a time corresponding to the period of the synchronization clock signal (the synchronization clock signal PLLOUT) which is set based on the phase comparison result from the phase comparator 330.

According to the third embodiment, the semiconductor integrated circuit 3 is configured to further include a controller (the controller 20) that causes the edge detection circuit (the edge detection circuit 310) to start detection of an edge (the rising edge in the first embodiment) and sets a time by which the edge detection signal ED is delayed in the delay adjuster 320 based on the phase comparison result from the phase comparator 330.

As described above, in the semiconductor integrated circuit 3 according to the third embodiment, similarly to the semiconductor integrated circuit according to the first embodiment or the second embodiment, the edge detection circuit 310 detects a rising edge of a reference clock signal RCK. In the semiconductor integrated circuit 3 according to the third embodiment, similarly to the semiconductor integrated circuit 2 according to the second embodiment, the delay adjuster 320 resets the clock division circuit 31 at a delayed timing. At this time, in the semiconductor integrated circuit 3 according to the third embodiment, the controller 20 sets the time by which the timing at which the delay adjuster 320 resets the clock division circuit 31 is delayed in the delay adjuster 320 based on the phase comparison result signal PD indicating the phase comparison result between the phase of the rising edge of the reference clock signal RCK and the phase of the rising edge of the internal clock signal ICK delayed by the dummy delayer 331 (the delayed internal clock signal DICK) from the phase comparator 330. Accordingly, in the semiconductor integrated circuit 3 according to the third embodiment, similarly to the semiconductor integrated circuit according to the first embodiment or the second embodiment, even when there is a propagation delay in the clock path of the internal clock signal ICK, the timing of the rising edge of the internal clock signal ICK which is generated by the clock division circuit 31 is displaced from the timing of the rising edge of the reference clock signal RCK (an originally oscillated clock signal Xtal). As a result, in the semiconductor integrated circuit 3 according to the third embodiment, similarly to the semiconductor integrated circuit according to the first embodiment or the second embodiment, even when power supply noise (self-noise) is generated in the system board of the device (system) in which the semiconductor integrated circuit 3 according to the third embodiment is mounted due to change (transition) in level of an output signal OUT which is output to the outside, a timing at which the power supply noise (self-noise) is generated is displaced from the timing of the rising edge of the reference clock signal RCK (the originally oscillated clock signal Xtal). Accordingly, in the semiconductor integrated circuit 3 according to the third embodiment, similarly to the semiconductor integrated circuit according to the first embodiment or the second embodiment, the generated power supply noise (self-noise) does not serve as a cause of fluctuation (generation of jitter) of the rising edge of the reference clock signal RCK (the originally oscillated clock signal Xtal). That is, in the semiconductor integrated circuit 3 according to the third embodiment, similarly to the semiconductor integrated circuit according to the first embodiment or the second embodiment, generation of power supply noise (self-noise) at a timing at which fluctuation (jitter) is generated in the rising edge of the reference clock signal RCK (the originally oscillated clock signal Xtal) is prevented.

Accordingly, in the device (system) in which the semiconductor integrated circuit 3 according to the third embodiment is mounted, similarly to the device (system) in which the semiconductor integrated circuit according to the first embodiment or the second embodiment is mounted, it is possible to curb deterioration in performance of the system as a whole due to power supply noise (self-noise) which is generated in the semiconductor integrated circuit 3 according to the third embodiment.

In the semiconductor integrated circuit 3 according to the third embodiment, the configuration in which the controller 20 sequentially changes the phase adjustment amount of the internal clock signal ICK generated by the clock division circuit 31 by repeatedly performing the phase adjustment operation based on the phase comparison result signal PD output from the phase comparator 330 has been described above. This is based on the configuration in which the phase comparator 330 outputs the phase comparison result signal PD indicating whether the phase of the rising edge of the delayed internal clock signal DICK is advanced or delayed with respect to the phase of the rising edge of the reference clock signal RCK. However, as described above, the phase comparator 330 provided in the semiconductor integrated circuit 3 may have any configuration and any operation as long as it can compare the phases of the delayed internal clock signal DICK and the originally oscillated clock signal Xtal. Accordingly, the phase comparator 330 provided in the semiconductor integrated circuit 3 may be configured, for example, to compare the phase of the rising edge of the reference clock signal RCK with the phase of the rising edge of the delayed internal clock signal DICK and to output the phase comparison result signal PD including information indicating the magnitude of the phase displacement amount. In this case, the controller 20 can immediately determine the time by which the delay adjuster 320 delays the edge detection signal ED based on the phase comparison result signal PD corresponding to one time output from the phase comparator 330 even without repeatedly performing the phase adjustment operation. In this case, the controller 20 may perform an operation of setting the phase adjustment amount of the internal clock signal ICK which is generated by the clock division circuit 31 in the delay adjuster 320 only once based on the determined result.

In the semiconductor integrated circuit according to the second embodiment or the third embodiment, the configuration in which the delay adjuster 320 displaces the timing of the rising edge of the internal clock signal ICK generated by the clock division circuit 31 from the timing of the rising edge of the reference clock signal RCK (the originally oscillated clock signal Xtal) in the units of periods of the synchronization clock signal PLLOUT based on the synchronization reset signal SR obtained by delaying the edge detection signal ED in the units of periods of the synchronization clock signal PLLOUT has been described above. However, in the semiconductor integrated circuit according to the second embodiment or the third embodiment, the delay amount of the propagation delay (the propagation delay 34) in the clock path of the internal clock signal ICK cannot be necessarily said to be expressed in the units of periods of the synchronization clock signal PLLOUT. That is, in the semiconductor integrated circuit according to the second embodiment or the third embodiment, it is conceivable that the delay time of the internal clock signal ICK which is input to the circuit elements provided in the large-scale circuit block 32 may be a time in one period of the synchronization clock signal PLLOUT. In this case, in the semiconductor integrated circuit according to the second embodiment or the third embodiment, since the phase of the internal clock signal ICK generated by the clock division circuit 31 is displaced in the units of periods of the synchronization clock signal PLLOUT, the generated power supply noise (self-noise) does not serve as a cause of fluctuation (generation of jitter) of the rising edge of the reference clock signal RCK (the originally oscillated clock signal Xtal). However, an amount (a phase adjustment amount of the internal clock signal ICK) by which the timing of the rising edge of the internal clock signal ICK generated by the clock division circuit 31 in the semiconductor integrated circuit according to the second embodiment or the third embodiment is delayed with respect to the timing of the rising edge of the reference clock signal RCK (the originally oscillated clock signal Xtal) is not limited to the units of periods of the synchronization clock signal PLLOUT. For example, in the semiconductor integrated circuit according to the second embodiment or the third embodiment, a configuration in which the timing of the rising edge of the internal clock signal ICK generated by the clock division circuit 31 is delayed with respect to the timing of the rising edge of the reference clock signal RCK (the originally oscillated clock signal Xtal) based on the propagation delay in the clock path of the internal clock signal ICK may be employed.

Fourth Embodiment

A semiconductor integrated circuit according to a fourth embodiment of the invention will be described below. The semiconductor integrated circuit according to the fourth embodiment of the invention employs a configuration in which the phase of an internal clock signal ICK is adjusted at a timing based on a propagation delay of the internal clock signal ICK in consideration of the fact that there is a propagation delay of a time other than units of periods of a synchronization clock signal PLLOUT in the clock path of the internal clock signal ICK.

Figure 9:
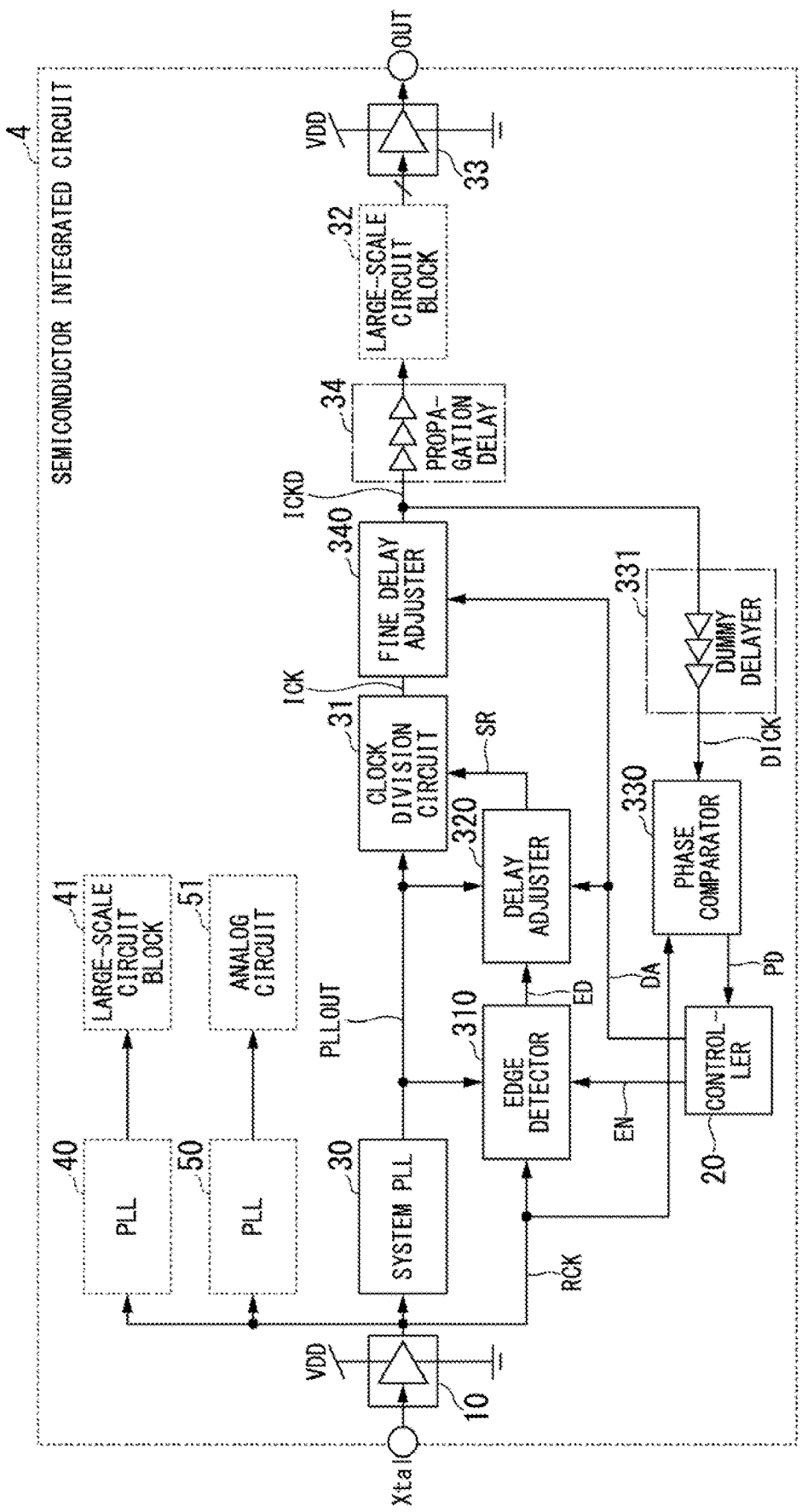
FIG. 9 is a block diagram schematically illustrating a configuration of a semiconductor integrated circuit according to a fourth embodiment of the invention.

FIG. 9 is a block diagram schematically illustrating the configuration of the semiconductor integrated circuit according to the fourth embodiment of the invention. The configuration of the semiconductor integrated circuit according to the fourth embodiment illustrated in FIG. 9 includes the same elements as in the semiconductor integrated circuit 1 according to the first embodiment illustrated in FIG. 2, the semiconductor integrated circuit 2 according to the second embodiment illustrated in FIG. 4, or the semiconductor integrated circuit 3 according to the third embodiment illustrated in FIG. 7. Accordingly, out of the elements of the semiconductor integrated circuit according to the fourth embodiment, the same elements as the elements of the semiconductor integrated circuit 1 according to the first embodiment, the semiconductor integrated circuit 2 according to the second embodiment, or the semiconductor integrated circuit 3 according to the third embodiment will be referred to by the same reference signs and detailed description of the elements will be omitted.

The semiconductor integrated circuit 4 illustrated in FIG. 9 includes a comparator 10, a controller 20, a system PLL 30, a clock division circuit 31, an edge detection circuit 310, a delay adjuster 320, a phase comparator 330, a dummy delayer 331, a fine delay adjuster 340, a large-scale circuit block 32, and an output buffer 33. In the semiconductor integrated circuit 4, the fine delay adjuster 340 is added to the semiconductor integrated circuit 3 according to the third embodiment. In the configuration of the semiconductor integrated circuit 4 illustrated in FIG. 9, similarly to the semiconductor integrated circuit 2 according to the second embodiment illustrated in FIG. 4 or the semiconductor integrated circuit 3 according to the third embodiment illustrated in FIG. 7, a propagation delay in a clock path of an internal clock signal ICK is schematically illustrated as a propagation delay 34. The semiconductor integrated circuit 4 further includes a PLL 40, a large-scale circuit block 41, a PLL 50, and an analog circuit 51.

Similarly to the semiconductor integrated circuit 1 according to the first embodiment illustrated in FIG. 2, the semiconductor integrated circuit 2 according to the second embodiment illustrated in FIG. 4, or the semiconductor integrated circuit 3 according to the third embodiment illustrated in FIG. 7, the semiconductor integrated circuit 4 is a large-scale semiconductor integrated circuit which is realized, for example, by an ASIC. Similarly to the semiconductor integrated circuit 1 according to the first embodiment, the semiconductor integrated circuit 2 according to the second embodiment, or the semiconductor integrated circuit 3 according to the third embodiment, the semiconductor integrated circuit 4 realizes a predetermined function in a device (system) in which the semiconductor integrated circuit 4 is mounted. Similarly to the semiconductor integrated circuit 1 according to the first embodiment, the semiconductor integrated circuit 2 according to the second embodiment, or the semiconductor integrated circuit 3 according to the third embodiment, the semiconductor integrated circuit 4 is mounted on a system board constituting a system of the device and performs an operation for realizing the predetermined function in the system of the device based on a clock signal of a predetermined frequency which is output from a clock supply circuit mounted on the same system board. In the following description, similarly to the semiconductor integrated circuit 1 according to the first embodiment, the semiconductor integrated circuit 2 according to the second embodiment, or the semiconductor integrated circuit 3 according to the third embodiment, it is assumed that the clock supply circuit mounted on the system board of the device is a crystal oscillator and the semiconductor integrated circuit 4 operates based on an originally oscillated clock signal Xtal which is oscillated from the crystal oscillator.

In the semiconductor integrated circuit 4, an internal clock signal ICK which is generated by the clock division circuit 31 is output to the fine delay adjuster 340 and an internal clock signal ICKD which is output from the fine delay adjuster 340 is output to the circuit elements in the large-scale circuit block 32. In the semiconductor integrated circuit 4, the internal clock signal ICK which is input to the dummy delayer 331 is replaced with the internal clock signal ICKD output from the fine delay adjuster 340. That is, the internal clock signal ICK which is output to the circuit elements in the semiconductor integrated circuit 3 according to the third embodiment is replaced with the internal clock signal ICKD output from the fine delay adjuster 340 in the semiconductor integrated circuit 4.

The fine delay adjuster 340 delays the internal clock signal ICK output from the clock division circuit 31 by a time in one period of a synchronization clock signal PLLOUT under the control of the controller 20. That is, the fine delay adjuster 340 finely adjusts a timing of a rising edge of the internal clock signal ICK to be synchronized with the propagation delay 34 in the clock path of the internal clock signal ICK. The fine delay adjuster 340 outputs the delayed internal clock signal ICK as the internal clock signal ICKD to the circuit elements of the large-scale circuit block 32 and the dummy delayer 331.

Figure 10:
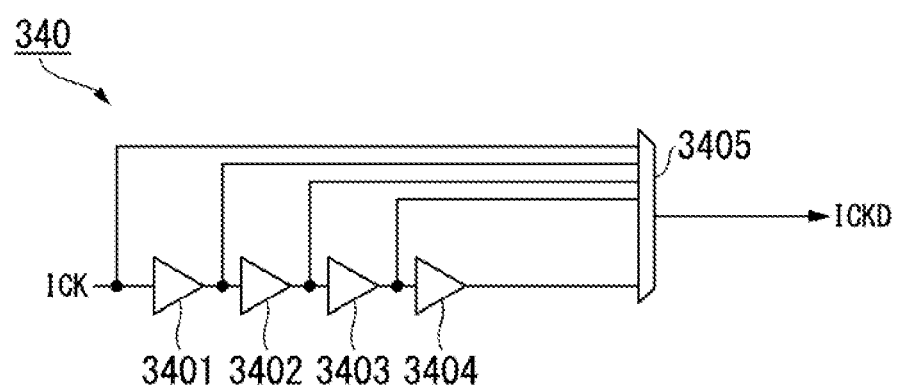
FIG. 10 is a block diagram schematically illustrating an example of a configuration of a fine delay adjuster which is provided in the semiconductor integrated circuit according to the fourth embodiment of the invention.

An example of the configuration of the fine delay adjuster 340 will be described below. FIG. 10 is a block diagram illustrating an example of the schematic configuration of the fine delay adjuster 340 which is provided in the semiconductor integrated circuit 4 according to the fourth embodiment of the invention. The fine delay adjuster 340 includes four buffer circuits 3401 to 3404 and a selector 3405. In the fine delay adjuster 340, the buffer circuit 3401, the buffer circuit 3402, the buffer circuit 3403, and the buffer circuit 3404 are sequentially connected in this order, and the internal clock signal ICK input to the fine delay adjuster 340 and output signals of the buffer circuits are connected as input signals to the selector 3405. In the fine delay adjuster 340, an input signal selected by the selector 3405 is output as the internal clock signal ICKD.

In the fine delay adjuster 340, each buffer circuit delays the input internal clock signal ICK or the output signal of the buffer circuit in the preceding stage by a delay time of an element in the buffer circuit and outputs the delayed signal. In the fine delay adjuster 340, the selector 3405 selects the internal clock signal ICK or one signal of the output signals of the four buffer circuits under the control of the controller 20 and outputs the selected signal as the internal clock signal ICKD.

With this configuration, the fine delay adjuster 340 outputs the internal clock signal ICK output from the clock division circuit 31 without any change or with a delay corresponding to one to four buffer circuits as the internal clock signal ICKD to the circuit elements of the large-scale circuit block 32 under the control of the controller 20. Accordingly, in the semiconductor integrated circuit 4, the phase of the internal clock signal ICKD with which the circuit elements of the large-scale circuit block 32 operate is displaced by one period to five periods of the synchronization clock signal PLLOUT similarly to the semiconductor integrated circuit 3 according to the third embodiment and is further displaced by one buffer circuit to four buffer circuits is employed.

FIG. 10 illustrates the configuration of the fine delay adjuster 340 that delays the internal clock signal ICK without any change or with a delay corresponding to one buffer circuit to fourth buffer circuits and outputs the internal clock signal ICK, but the configuration of the fine delay adjuster 340 is not limited to the configuration illustrated in FIG. 10. For example, the fine delay adjuster 340 may employ a configuration in which a number of buffer circuits with which a delay time of one period of the synchronization clock signal PLLOUT can be set are provided. With this configuration, the fine delay adjuster 340 can delay the internal clock signal ICK at any timing in one period of the synchronization clock signal PLLOUT and output the delayed signal as the internal clock signal ICKD under the control of the controller 20. Accordingly, even when the semiconductor integrated circuit 2 is mounted on various devices, it is possible to suitably change the phase adjustment amount of the internal clock signal ICKD. The fine delay adjuster 340 may employ any configuration as long as it is a configuration in which the internal clock signal ICK can be delayed and output as the internal clock signal ICKD.

The fine delay adjuster 340 may employ a configuration in which the phase adjustment amount of the internal clock signal ICK is fixed instead of the configuration in which the time by which the internal clock signal ICK is delayed is changed. In this case, the fine delay adjuster 340 may not include the selector 3405 and employ a configuration in which an output signal of the buffer circuit in the final stage (the buffer circuit 3404 in FIG. 10) is output as the internal clock signal ICKD to the circuit elements of the large-scale circuit block 32 and the dummy delayer 331.

The dummy delayer 331 delays the internal clock signal ICK output from the fine delay adjuster 340 by the same delay time as the propagation delay 34 and outputs the delayed signal as the internal clock signal DICK to the phase comparator 330.

In the semiconductor integrated circuit 4, the controller 20 determines the time by which the fine delay adjuster 340 delays the internal clock signal ICK at the time of finely adjusting the phase of the internal clock signal ICK based on the same idea as the phase adjustment of the internal clock signal ICK in the semiconductor integrated circuit 3 according to the third embodiment, and sets the phase adjustment amount of the internal clock signal ICK in the fine delay adjuster 340 based on the determination result. At this time, a signal that is used for the controller 20 to set the phase adjustment amount of the internal clock signal ICK in the fine delay adjuster 340 may be the same signal as the delay adjustment signal DA that is used for the controller 20 to set the phase adjustment amount of the internal clock signal ICK in the delay adjuster 320. In the semiconductor integrated circuit 4 illustrated in FIG. 9, the controller 20 also outputs the delay adjustment signal DA to the fine delay adjuster 340. That is, a configuration in which the controller 20 sets the times by which the delay adjuster 320 and the fine delay adjuster 340 delay the corresponding signals based on the delay adjustment signal DA is illustrated. In this case, in the semiconductor integrated circuit 4, the controller 20 determines the number of stages of buffer circuits which are provided in the fine delay adjuster 340 and by which the internal clock signal ICK is delayed and outputs information indicating the determined number of stages as the delay adjustment signal DA to the selector 3405 provided in the fine delay adjuster 340. In the semiconductor integrated circuit 4, the selector 3405 provided in the fine delay adjuster 340 selects the output signal output from a number of stages of buffer circuits indicated by the delay adjustment signal DA, and outputs the selected signal as the internal clock signal ICKD to the circuit elements in the large-scale circuit block 32 and the dummy delayer 331. Accordingly, in the semiconductor integrated circuit 4, the phase of the internal clock signal ICK which is generated by the clock division circuit 31 is changed, that is, the phase adjustment amount of the internal clock signal ICK which has not been delayed yet by the fine delay adjuster 340 is changed, based on a phase difference between the reference clock signal RCK and the delayed internal clock signal DICK including the delay time in the fine delay adjuster 340 from the phase comparator 330.

Accordingly, in the semiconductor integrated circuit 4, the level of an output signal OUT which is output from the output buffer 33 changes (transitions) at a timing which is delayed by a time in one period of the synchronization clock signal PLLOUT by the fine delay adjuster 340 in comparison with that in the semiconductor integrated circuit 3 according to the third embodiment. In the semiconductor integrated circuit 4, similarly to the semiconductor integrated circuit 1 according to the first embodiment, the semiconductor integrated circuit 2 according to the second embodiment, or the semiconductor integrated circuit 3 according to the third embodiment, power supply noise (self-noise) due to change (transition) in level of the output signal OUT does not serve as a cause of generation of jitter in the rising edge of the originally oscillated clock signal Xtal oscillated from the clock supply circuit (the crystal oscillator) or the reference clock signal RCK output from the comparator 10. On the other hand, in the semiconductor integrated circuit 4, since the level of the output signal OUT changes (transitions) at a timing based on the phase difference between the reference clock signal RCK and the delayed internal clock signal DICK including the delay time in the fine delay adjuster 340, it is possible to curb jitter which may be generated at the rising edge of the originally oscillated clock signal Xtal or the reference clock signal RCK more suitably than in the semiconductor integrated circuit 3 according to the third embodiment.

In the semiconductor integrated circuit 4, the phase adjustment amount of the internal clock signal ICK is different from that in the semiconductor integrated circuit 2 according to the second embodiment or the semiconductor integrated circuit 3 according to the third embodiment, but the phase adjustment operation for the internal clock signal ICK in the semiconductor integrated circuit 4 is the same as that in the semiconductor integrated circuit 2 according to the second embodiment or the semiconductor integrated circuit 3 according to the third embodiment. Accordingly, detailed description of the phase adjustment operation for the internal clock signal ICK in the semiconductor integrated circuit 4 will be omitted.

In this way, in the semiconductor integrated circuit 4, the fine delay adjuster 340 delays the internal clock signal ICK generated by the clock division circuit 31 by a time in one period of the synchronization clock signal PLLOUT. In the semiconductor integrated circuit 4, similarly to the semiconductor integrated circuit 3 according to the third embodiment, the phase comparator 330 compares the phase of the rising edge of the internal clock signal ICK delayed by the dummy delayer 331 (the delayed internal clock signal DICK including the delay time in the fine delay adjuster 340) with the phase of the rising edge of the reference clock signal RCK (the originally oscillated clock signal Xtal). In the semiconductor integrated circuit 4, the controller 20 sets the time by which the delay adjuster 320 delays the edge detection signal ED and the time by which the fine delay adjuster 340 delays the internal clock signal ICK, that is, the phase adjustment amount of the internal clock signal ICK generated by the clock division circuit 31, in the delay adjuster 320 and the fine delay adjuster 340 based on the phase comparison result signal PD output from the phase comparator 330. Accordingly, in the semiconductor integrated circuit 4, even when there is a propagation delay in the clock path of the internal clock signal ICK, the timing of the rising edge of the internal clock signal ICK is displaced from the timing of the rising edge of the reference clock signal RCK (the originally oscillated clock signal Xtal). Accordingly, in the semiconductor integrated circuit 4, similarly to the semiconductor integrated circuit 1 according to the first embodiment, the semiconductor integrated circuit 2 according to the second embodiment, or the semiconductor integrated circuit 3 according to the third embodiment, the timing of power supply noise (self-noise) which is generated in the system board of the device due to change (transition) in level of the output signal OUT which is output to the outside is displaced from the timing of the rising edge of the reference clock signal RCK (the originally oscillated clock signal Xtal). Accordingly, in the semiconductor integrated circuit 4, similarly to the semiconductor integrated circuit 1 according to the first embodiment, the semiconductor integrated circuit 2 according to the second embodiment, or the semiconductor integrated circuit 3 according to the third embodiment, even when power supply noise (self-noise) is generated, the power supply noise does not serve as a cause of fluctuation (generation of jitter) of the rising edge of the reference clock signal RCK (the originally oscillated clock signal Xtal). In other words, in the semiconductor integrated circuit 4, similarly to the semiconductor integrated circuit 1 according to the first embodiment, the semiconductor integrated circuit 2 according to the second embodiment, or the semiconductor integrated circuit 3 according to the third embodiment, power supply noise (self-noise) serving as a cause of generation of fluctuation (jitter) of the rising edge of the reference clock signal RCK (the originally oscillated clock signal Xtal) is removed.

According to the fourth embodiment, the semiconductor integrated circuit (the semiconductor integrated circuit 4) is configured to further include a fine delay adjuster (the fine delay adjuster 340) that delays the divided clock signal (the internal clock signal ICK) by a time in one period of the synchronization clock signal (the synchronization clock signal PLLOUT), and the delayer (the dummy delayer 331) further delays the internal clock signal ICK delayed by the fine delay adjuster 340 by the time corresponding to the propagation delay (the propagation delay 34).

According to the fourth embodiment, the semiconductor integrated circuit 4 is configured such that the fine delay adjuster 340 delays the internal clock signal ICK by a time which is set based on the phase comparison result from the phase comparator (the phase comparator 330).

According to the fourth embodiment, the semiconductor integrated circuit 4 is configured to further include a controller (the controller 20) that causes the edge detection circuit (the edge detection circuit 310) to start detection of an edge (the rising edge in the first embodiment), to set a time by which the edge detection signal (the edge detection signal ED) is delayed in the delay adjuster (the delay adjuster 320) based on the phase comparison result from the phase comparator 330, and to set a time by which the internal clock signal ICK is delayed in the fine delay adjuster 340.

As described above, in the semiconductor integrated circuit 4 according to the fourth embodiment, similarly to the semiconductor integrated circuits according to the first to third embodiments, the edge detection circuit 310 detects a rising edge of a reference clock signal RCK. In the semiconductor integrated circuit 4 according to the fourth embodiment, similarly to the semiconductor integrated circuits according to the second and third embodiments, the delay adjuster 320 resets the clock division circuit 31 at a delayed timing. At this time, in the semiconductor integrated circuit 4 according to the fourth embodiment, the controller 20 sets the time by which the timing at which the delay adjuster 320 resets the clock division circuit 31 is delayed in the delay adjuster 320 based on the phase comparison result signal PD indicating the phase comparison result between the phase of the rising edge of the reference clock signal RCK and the phase of the rising edge of the internal clock signal ICK delayed by the dummy delayer 331 (the delayed internal clock signal DICK including the delay time in the fine delay adjuster 340) from the phase comparator 330. In the semiconductor integrated circuit 4 according to the fourth embodiment, the controller 20 sets a time in one period of the synchronization clock signal PLLOUT by which the internal clock signal ICK generated by the clock division circuit 31 is delayed by the fine delay adjuster 340 in the fine delay adjuster 340. Accordingly, in the semiconductor integrated circuit 4 according to the fourth embodiment, similarly to the semiconductor integrated circuits according to the first to third embodiments, even when there is a propagation delay in the clock path of the internal clock signal ICK, the timing of the rising edge of the internal clock signal ICK which is generated by the clock division circuit 31 is displaced from the timing of the rising edge of the reference clock signal RCK (an originally oscillated clock signal Xtal). As a result, in the semiconductor integrated circuit 4 according to the fourth embodiment, similarly to the semiconductor integrated circuits according to the first to third embodiments, even when power supply noise (self-noise) is generated in the system board of the device (system) in which the semiconductor integrated circuit 4 according to the fourth embodiment is mounted due to change (transition) in level of an output signal OUT which is output to the outside, a timing at which the power supply noise (self-noise) is generated is displaced from the timing of the rising edge of the reference clock signal RCK (the originally oscillated clock signal Xtal). Accordingly, in the semiconductor integrated circuit 4 according to the fourth embodiment, similarly to the semiconductor integrated circuits according to the first to third embodiments, the generated power supply noise (self-noise) does not serve as a cause of fluctuation (generation of jitter) of the rising edge of the reference clock signal RCK (the originally oscillated clock signal Xtal). That is, in the semiconductor integrated circuit 4 according to the fourth embodiment, similarly to the semiconductor integrated circuits according to the first to third embodiments, generation of power supply noise (self-noise) at a timing at which fluctuation (jitter) is generated in the rising edge of the reference clock signal RCK (the originally oscillated clock signal Xtal) is prevented.

Accordingly, in the device (system) in which the semiconductor integrated circuit 4 according to the fourth embodiment is mounted, similarly to the device (system) in which the semiconductor integrated circuit according to any one of the first to third embodiments is mounted, it is possible to curb deterioration in performance of the system as a whole due to power supply noise (self-noise) which is generated in the semiconductor integrated circuit 4 according to the fourth embodiment.

In the semiconductor integrated circuit 4 according to the fourth embodiment, similarly to the semiconductor integrated circuit 3 according to the third embodiment, the controller 20 may be configured to sequentially change the phase adjustment amount of the internal clock signal ICK generated by the clock division circuit 31 by repeatedly performing the phase adjustment operation based on the phase comparison result signal PD output from the phase comparator 330. However, in the semiconductor integrated circuit 4 according to the fourth embodiment, similarly to the semiconductor integrated circuit 3 according to the third embodiment, the phase comparator 330 may be configured to output the phase comparison result signal PD including information indicating the magnitude of the phase displacement amount and the controller 20 may be configured not to repeat the phase adjustment operation. That is, in the semiconductor integrated circuit 4 according to the fourth embodiment, similarly to the semiconductor integrated circuit 3 according to the third embodiment, the controller 20 may perform an operation of setting the phase adjustment amount of the internal clock signal ICK which is generated by the clock division circuit 31 in the delay adjuster 320 and the fine delay adjuster 340 only once based on the phase comparison result signal PD corresponding to one time output from the phase comparator 330.

In the semiconductor integrated circuit 4 according to the fourth embodiment, similarly to the semiconductor integrated circuit 3 according to the third embodiment, the controller 20 may be configured to store the final delay adjustment value by which the phase adjustment amount of the internal clock signal ICK generated from the clock division circuit 31 is changed. In this case, in the device (system) in which the semiconductor integrated circuit 4 according to the fourth embodiment is mounted, similarly to the device (system) in which the semiconductor integrated circuit 3 according to the third embodiment is mounted, for example, when a low power consumption mode such as a standby mode or a sleep mode is returned to a normal operation mode, the controller 20 can change the phase adjustment amount of the internal clock signal ICK generated from the clock division circuit 31 based on the stored delay adjustment value.

As described above, according to the embodiments of the invention, a semiconductor integrated circuit includes an edge detection circuit that detects a rising edge of a reference clock signal (an originally oscillated clock signal) and resets a clock division circuit generating an internal clock signal at a timing of the detected reference clock signal. Accordingly, in the semiconductor integrated circuits according to the embodiments of the invention, the timing of the rising edge of the internal clock signal generated by the clock division circuit is displaced from the timing of the rising edge of the reference clock signal. That is, in the semiconductor integrated circuits according to the embodiments of the invention, the phase of the internal clock signal generated by the clock division circuit is displaced from the phase of the reference clock signal. Accordingly, in the embodiments of the invention, the timing at which a level of an output signal which is output to the outside by the semiconductor integrated circuit changes (transitions) is displaced from the timing of the rising edge of the reference clock signal. As a result, in the embodiments of the invention, power supply noise (self-noise) which is generated in a system board of a device (system) in which the semiconductor integrated circuit is mounted due to change (transition) in level of the output signal output from the semiconductor integrated circuit to the outside does not serve as a cause of fluctuation (generation of jitter) of the rising edge of the reference clock signal.

According to the embodiments of the invention, the semiconductor integrated circuit includes a delay adjuster that delays the timing at which the edge detection circuit resets the clock division circuit in the units of periods of an original clock signal (a PLL clock signal) of the internal clock signal generated by frequency division in the clock division circuit. In the embodiments of the invention, the controller sets the time by which the timing at which the delay adjuster resets the clock division circuit is delayed. Accordingly, in the embodiments of the invention, even when there is a propagation delay in the clock path of the internal clock signal in the semiconductor integrated circuit, the phase of the internal clock signal is displaced from the phase of the reference clock signal and power supply noise (self-noise) which is generated in the system board of the device (system) in which the semiconductor integrated circuit is mounted does not serve as a cause of fluctuation (generation of jitter) of the rising edge of the reference clock signal.

According to the embodiments of the invention, the semiconductor integrated circuit includes a dummy delayer that simulates a delay amount of a propagation delay in the clock path of the internal clock signal and a phase comparator that compares the phase of the internal clock signal delayed by the dummy delayer with the phase of the reference clock signal. In the embodiments of the invention, the semiconductor integrated circuit includes a fine delay adjuster that delays the internal clock signal generated by the clock division circuit by a time in one period of the original clock signal (the PLL clock signal) which is used to generate the internal clock signal. In the embodiments of the invention, the controller changes (adjusts) the timing at which the clock division circuit is reset, that is, the phase of the internal clock signal, based on a phase difference between the reference clock signal and the internal clock signal delayed by the dummy delayer. Accordingly, in the semiconductor integrated circuit according to the embodiments of the invention, the phase of the internal clock signal is displaced from the phase of the reference clock signal based on the phase difference between the reference clock signal and the delayed internal clock signal, and power supply noise (self-noise) which is generated in the system board of the device (system) in which the semiconductor integrated circuit is mounted does not serve as a cause of fluctuation (generation of jitter) of the rising edge of the reference clock signal.

In this way, in the semiconductor integrated circuit according to the embodiments of the invention, it is possible to prevent generation of power supply noise (self-noise) at a timing at which fluctuation (jitter) is generated in the rising edge of the reference clock signal. That is, in the device (system) in which the semiconductor integrated circuit according to the embodiments of the invention is mounted, it is possible to curb fluctuation (jitter) of the rising edge of the reference clock signal due to power supply noise which is generated in the semiconductor integrated circuit. Accordingly, in the device (system) in which the semiconductor integrated circuit according to the embodiments of the invention is mounted, it is possible to curb deterioration in performance of the system as a whole due to power supply noise (self-noise) which is generated in the semiconductor integrated circuit.

In the embodiments of the invention, the configuration in which the semiconductor integrated circuit according to the invention prevents generation of power supply noise (self-noise) at a timing at which it serves as a cause of fluctuation (generation of jitter) of the rising edge of the reference clock signal has been described above. However, in the semiconductor integrated circuit, it is conceivable that power supply noise (self-noise) associated with the phases of the reference clock signal and the internal clock signal is generated in a relationship between other edges. For example, when the semiconductor integrated circuit operates with falling edges of the reference clock signal as references, it is conceivable that power supply noise (self-noise) is generated due to a relationship between the falling edge of the reference clock signal and the falling edge or the rising edge of the internal clock signal. In this case, the idea in the semiconductor integrated circuit according to the invention, that is, the idea that the timing of the rising edge of the internal clock signal is displaced from the timing of the rising edge of the reference clock signal, can be similarly and easily applied to any relationship between the edges of the clock signals. The same advantageous effects are obtained by applying the idea in the semiconductor integrated circuit according to the invention thereto.

While exemplary embodiments of the invention have been described above, the invention is not limited to the embodiments and modified examples thereof. Addition, omission, substitution, and other modifications of a configuration can be performed without departing from the gist of the invention.

The invention is not limited to the aforementioned description but is defined by only the appended claims.

According to the embodiments, it is possible to curb fluctuation of a clock signal due to power supply noise which is generated in a semiconductor integrated circuit.

What is claimed is:

1. A semiconductor integrated circuit, comprising:
    a phase synchronization circuit configured to be synchronized with a reference clock signal and to generate a synchronization clock signal by multiplying the reference clock signal;
    an edge detection circuit configured to detect an edge at which a signal waveform of the reference clock signal changes at a timing based on the synchronization clock signal and to output an edge detection signal indicating the timing at which the edge has been detected; and
    a clock division circuit configured to be reset at a timing based on the edge detection signal and to generate a divided clock signal by dividing the synchronization clock signal.

2. The semiconductor integrated circuit according to claim 1, wherein the edge detection circuit outputs the edge detection signal corresponding to one period of the synchronization clock signal.

3. The semiconductor integrated circuit according to claim 2, further comprising:
    a delay adjuster configured to delay the edge detection signal in the units of periods of the synchronization clock signal.

4. The semiconductor integrated circuit according to claim 3, further comprising:
    a delayer configured to simulate a propagation delay in a path of the divided clock signal and to delay the divided clock signal by a time corresponding to the propagation delay; and
    a phase comparator configured to compare a phase of the divided clock signal delayed by the delayer with a phase of the reference clock signal.

5. The semiconductor integrated circuit according to claim 4, wherein the delay adjuster delays the edge detection signal by a time corresponding to a period of the synchronization clock signal which is set based on a phase comparison result from the phase comparator.

6. The semiconductor integrated circuit according to claim 5, further comprising:
    a fine delay adjuster configured to delay the divided clock signal by a time in one period of the synchronization clock signal,
    wherein the delayer further delays the divided clock signal delayed by the fine delay adjuster by the time corresponding to the propagation delay.

7. The semiconductor integrated circuit according to claim 6, wherein the fine delay adjuster delays the divided clock signal by a time which is set based on the phase comparison result from the phase comparator.

8. The semiconductor integrated circuit according to claim 1, further comprising:
    a controller configured to cause the edge detection circuit to start detection of the edge.

9. The semiconductor integrated circuit according to claim 3, further comprising:
    a controller configured to cause the edge detection circuit to start detection of the edge and to set a time by which the edge detection signal is delayed in the delay adjuster.

10. The semiconductor integrated circuit according to claim 4, further comprising:
    a controller configured to cause the edge detection circuit to start detection of the edge and to set a time by which the edge detection signal is delayed in the delay adjuster based on the phase comparison result from the phase comparator.

11. The semiconductor integrated circuit according to claim 6, further comprising:
    a controller configured to cause the edge detection circuit to start detection of the edge, to set a time by which the edge detection signal is delayed in the delay adjuster based on the phase comparison result from the phase comparator, and to set a time by which the divided clock signal is delayed in the fine delay adjuster.

* * * * *